(12) United States Patent  
Baker et al.

(10) Patent No.: US 9,312,342 B2  
(45) Date of Patent: Apr. 12, 2016

(54) GENERATION OF HIGHLY N-TYPE, DEFECT PASSIVATED TRANSITION METAL OXIDES USING PLASMA FLUORINE INSERTION

(75) Inventors: L. Robert Baker, Albany, CA (US); Hyungtak Seo, Seoul (KR); Antoine Hervier, Paris (FR); Gabor A. Somorjai, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 30 days.

(21) Appl. No.: 13/994,663

(22) PCT Filed: Dec. 16, 2011

(86) PCT No.: PCT/US2011/065587  
§ 371 (c)(1),  
(2), (4) Date: Nov. 19, 2013

(87) PCT Pub. No.: WO2012/083220  
PCT Pub. Date: Jun. 21, 2012

(65) Prior Publication Data  
US 2014/0306215 A1    Oct. 16, 2014

Related U.S. Application Data

(60) Provisional application No. 61/423,959, filed on Dec. 16, 2010.

(51) Int. Cl.  
*H01L 31/06* (2012.01)  
*H01L 21/31* (2006.01)  
*H01L 29/24* (2006.01)  
(Continued)

(52) U.S. Cl.  
CPC .......... *H01L 29/24* (2013.01); *H01L 21/02565* (2013.01); *H01L 21/02576* (2013.01); *H01L 21/02631* (2013.01); *H01L 21/324* (2013.01); *H01L 27/2436* (2013.01); *H01L 45/08* (2013.01); *H01L 45/1233* (2013.01); *H01L 45/146* (2013.01); *H01L 45/1625* (2013.01); *H01L 45/1641* (2013.01)

(58) Field of Classification Search  
IPC ................................................. H01M 4/86,8/10  
See application file for complete search history.

(56) References Cited

U.S. PATENT DOCUMENTS 3,502,953 A    3/1970  Aronson  
4,511,638 A    4/1985  Sapru et al.  
(Continued)

OTHER PUBLICATIONS

Schwab, G. M. Metal Electrons and Catalysis. Transactions of the Faraday Society 42, 689-697 (1946).  
(Continued)

*Primary Examiner* — Melvin C Mayes  
*Assistant Examiner* — Colette Nguyen  
(74) *Attorney, Agent, or Firm* — Lawrence Berkeley National Laboratory

(57) ABSTRACT

A new composition of matter is disclosed wherein oxygen vacancies in a semiconducting transition metal oxide such as titanium dioxide are filled with a halogen such as Fluorine, whereby the conductivity of the composition is greatly enhanced, while at the same time the chemical stability of the composition is greatly improved. Stoichiometric titanium dioxide having less than 3 % oxygen vacancies is subject to fluorine insertion such that oxygen vacancies are filled, limited amounts of fluorine replace additional oxygen atoms and fluorine interstitially inserts into the body of the $TiO_2$ composition.

21 Claims, 17 Drawing Sheets

(51) Int. Cl.
*H01L 21/02* (2006.01)
*H01L 21/324* (2006.01)
*H01L 45/00* (2006.01)
*H01L 27/24* (2006.01)

(56) References Cited

U.S. PATENT DOCUMENTS

| | | | | |
|---|---|---|---|---|
| 5,135,581 | A * | 8/1992 | Tran et al. | 136/256 |
| 7,846,822 | B2 * | 12/2010 | Seebauer et al. | 438/510 |
| 7,943,468 | B2 * | 5/2011 | Curello et al. | 438/289 |
| 2003/0077914 | A1 | 4/2003 | Le et al. | |
| 2005/0121750 | A1 | 6/2005 | Chan et al. | |
| 2006/0257719 | A1 | 11/2006 | Merzougui et al. | |
| 2008/0076268 | A1 * | 3/2008 | Kraus et al. | 438/785 |
| 2008/0106927 | A1 | 5/2008 | Celinska et al. | |
| 2009/0102027 | A1 | 4/2009 | Toriumi et al. | |
| 2010/0025787 | A1 | 2/2010 | Geis et al. | |
| 2010/0285388 | A1 | 11/2010 | Schank et al. | |

OTHER PUBLICATIONS

Tauster, S. J., Fung, S. C., Baker, R. T. K. & Horsley, J. A. Strong-Interactions in Supported-Metal Catalysts. Science 211, 1121-1125 (1981).
Tauster, S. J. Strong metal-support interactions. Accounts of Chemical Research 20, 389-394, (1987).
Somorjai, G. A. & Li, Y. Introduction to surface chemistry and catalysis. 1st Edition, (Johns Wiley & Sons, Inc., 1994), pp. 492-493.
International Search Report and Written Opinion for International Application No. PCT/US11/65587 mailed Apr. 19, 2013.
Hyungtak Seo et al, "Generation of Highly n-Type Titanium Oxide Using Plasma Fluorine Insertion," Nano Lett. 2011, 11, 751-756.
L. Robert Baker et al., "Highly n-Type Titanium Oxide as an Electronically Active Support for Platinum in the Catalytic Oxidation of Carbon Monoxide," J. Phys. Chem. C, 2011, 115 (32), pp. 16006-16011.
L. Robert Baker et al., "Catalyst Electronic Structure and Charge Transfer at the Metal-Oxide Interface," poster presented at the 241st ACS National Meeting, Spring 2011, Anaheim, CA, presented Mar. 28, 2011.
Antoine Hervier et al., "Tuning the surface chemistry of a catalyst by modifying its electronic structure," presentation at the 241st ACS National Meeting, Spring 2011, Anaheim, CA, presented Mar. 31, 2011.
Tauster, S. J.; Fung, S. C.; Garten, R. L.; "Strong metal-support interactions. Group 8 noble metals supported on titanium dioxide," J. Am. Chem. Soc. 1978, 100, 170.
Park, J. Y.; Somorjai, G. A.. "The Catalytic Nanodiode: Detecting Continous Electron Flow at Oxide-Metal Interfaces Generated by a Gas-Phase Exothermic Reaction," ChemPhysChem 2006, 7, 1409.

* cited by examiner

A. MOSFET gate stacks with resistive memory cell

B. Transparent Thin Film Transistor (TFT) gate stacks

GENERATION OF HIGHLY N-TYPE, DEFECT PASSIVATED TRANSITION METAL OXIDES USING PLASMA FLUORINE INSERTION

CROSS REFERENCE TO RELATED APPLICATIONS

This application claims priority to PCT Application PCT/US2011/065587, filed Dec. 16, 2011, which in turn claims priority to U.S. Provisional Application Ser. No. 61/423,959 filed Dec. 16, 2010, entitled Generation of Highly N-Type, Defect Passivated Transition Metal Oxides Using Plasma Fluorine Insertion, Robert L. Baker, et al. inventors, the contents of which provisional application is incorporated herein as if fully set out in its entirety.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

1. Field of the Invention

This invention relates generally to transition metal oxide semiconductors, and, more specifically to transition metal oxide compositions of matter and methods for insertion of a halogen moiety such as fluorine into said metal oxides to provide a chemically stable, highly conductive semi-conductive material, which has particular utility for catalytic reactions, semiconductor devices, and transparent flat screen displays.

2. Brief Description of the Related Art

The application of transition metal oxide (TMO) semiconductors for charge-based devices is becoming prevalent for chemical, electrical, and energy applications. TMO semiconductors (e.g. $TiO_2$, $CO_2O_3$, $CeO_2$, $ZnO$, $SnO$, and $WO_2$) have been widely studied for use in such applications as photo catalysts, photovoltaic solar cells, transparent oxide thin film transistors, resistive switching memory and chemical sensors. Among the TMOs, titanium oxide is among one of the most widely studied for use in photo catalysis, light harvesting, resistive switching memory, and chemical sensing as an intrinsic n-type semiconductor.

In TMO semiconductors, oxygen (O) vacancies act as intrinsic n-type donors leading to enhanced surface conductivity compared to the fully oxidized stoichiometric metal oxide. Consequently control of TMO surface conductivity is possible by controlling O vacancy concentration. However, the intrinsic doping of TMOs through manipulation of O vacancies is equivalent to the formation of reduced oxides, which eventually results in metallic conduction. This not only compromises the use of the metal oxides as a semiconductor material, but also gives rise to charge trapping at defect (i.e. O vacancy) locations, and surface Fermi energy ($E_f$) level pinning. Additionally, the electric activity (e.g. charge trapping) and chemical reactivity of O vacancies create problems of material stability/reliability. In fact, these materials are so unstable that in liquid crystal display applications, they will not work after a period of just several hours. Consequently, highly conductive titanium oxide is seldom useful for device architecture, and fabrication of highly conductive, defect-free titanium oxide remains an important challenge.

The extrinsic chemical doping of stoichiometric titanium oxide using impurity dopants (e.g. N, S, and C) by colloidal synthesis methods to modify the electronic structure and achieve visible light absorption has been actively studied for photo-catalytic applications. Additionally, metal impurity (e.g. V, Ni, and Nb) doping of titanium oxide has been used to modify $E_F$ and increase conductivity. However, in each of these cases, the semiconductor properties of titanium oxide have been found to be compromised by the formation of metallic mid-gap states having an energy level less than intrinsic bandgap energy.

SUMMARY OF THE INVENTION

Transition metal oxide films are typically formed using magnetron sputtering techniques wherein a transition metal target is provided, such as one made of titanium, and magnetron sputtering conducted at low pressures, such as in the order of $10^{-6}$ to $10^{-7}$ Torr, in an argon atmosphere at the flow rate of 50 SCCM in the presence of oxygen at the flow rate of 3 SCCM (i.e., ratio of $O_2/Ar~6\%$). The metal oxide may also be in the form of a mesoporous structure (a mesoporous structure is a solid containing pores with diameters between 2 and 50 nm).

The substrate upon which the film is to be deposited is usually maintained at a negative potential relative to the potential of the plasma, the greater the bias relative to the substrate, the higher the kinetic energy of ions striking the substrate during film formation. By this process, it has been found that the films as deposited, while highly conductive, have a high oxygen deficiency, and accordingly are less stable, with the higher the number of oxygen deficiencies the less stable the material. To allow for the tuning of the oxygen vacancy concentration, the as-deposited film in one embodiment is subject to a rapid thermal annealing step in the presence of $O_2$, incorporating O into the $TiO_x$ lattice by a factor of 1.2 at the maximum against the as-deposited film, thus reducing the number of vacancies, though at the same time reducing film conductivity.

By way of this invention it has been found that by the subsequent introduction of a halogen gas such as fluorine, or chlorine into the annealed film, the inventors have been able to increase conductivity dramatically without sacrificing stability. In the case of fluorine, for example, the introduced fluorine binds to the transition metal oxide at the oxygen vacancies, i.e. it fills the holes to both increase conductivity and stabilize the metal oxide. The fluorine (F) can be inserted into the film, in one embodiment by treatment in an $N_2$ plasma into which a source of fluorine, for example as a mixture of gases such as $CF_x$ and $SF_x$ has been introduced. In another embodiment, the introduced fluorine gas is $SF_6$, the gas introduced in trace quantities (e.g. in a process where the process pressure 50 m Torr, the SF6 partial pressure is <5 m Torr).

As will be later described, experimental results suggest that the fluorine actually introduces into the film in one of three ways: (1) interstitially (about 6~8% in the amount of F species bound to Ti), (2) by substitution for oxygen atoms (about 26~36%), and (3) by filling of O vacancies (about 0~22%), all modalities contributing to enhanced conductivity. In one experiment it was found that for stoichiometric $TiO_2$, the ratio of O vacancy doping (i.e. the ratio of $Ti^{3+}/Ti^{4+}$) to F insertion (i.e. the ratio of F/Ti) was about 1:10, with conductivity enhanced by a factor of $10^2$ when compared to other oxygen deficient films such as $TiO_{1.7}$, and $TiO_{1.9}$. F-doped TiO2 was still less conductive than the O-vacancy doped $TiO_x$ (x<2)

with or without F. However, the F increased the conductivity of $TiO_2$ without the addition of O-vacancies. Hence, F is a way to increase conductivity while avoiding unstable O-vacancies, although the overall conductivity of F-doped $TiO_2$ is still less than O-vacancy doped $TiO_x$ (x<2).

In one embodiment, a composition of matter is described comprising a transition metal oxide material, including oxygen vacancies, in which the composition has been passivated with a halogen such that halogen atoms fill oxygen vacancies.

In one embodiment, a semiconductor comprising the composition of matter is described.

In one embodiment, a transistor including a transition metal semiconducting channel layer, wherein the said channel layer comprises the composition of matter is described.

In one embodiment, a method for preparing a halogen inserted transition metal oxide semiconductor material is described comprising magnetron sputtering of a transition metal containing target in the presence of oxygen onto a substrate to form a film of transition metal oxide; rapid thermal anneal of the as-deposited film; and, exposure of the film to halogen gas in an $N_2$ plasma to cause insertion of said halogen into the transition metal oxide film.

In one embodiment, a composition of matter is described comprising a transition metal oxide material, including oxygen vacancies, in which the composition has been passivated with a halogen such that halogen atoms fill oxygen vacancies, and a metal catalyst disposed thereon.

The composition of matter wherein the halogen gas is fluorine, wherein the transition metal oxide is titanium oxide, wherein the transition metal oxide is titanium dioxide, wherein the conductivity of the transition metal oxide material is above 10 S cm$^{-1}$, wherein the metal catalyst is platinum, wherein the metal catalyst is in the form of nanoparticles, wherein the metal catalyst is in the form of a thin film, wherein the thin film is discontinuous such that the metal oxide is exposed.

In one embodiment, a method for catalyzing a reaction utilizing a doped metal oxide and a metal catalyst is described comprising providing the doped metal oxide with the metal catalyst disposed thereon; providing at least one reactant to be catalyzed in the reaction; and catalyzing the reaction utilizing the at least one reactant and the doped metal oxide with the metal catalyst disposed thereon.

The method wherein the dopant in the metal oxide is a halogen, wherein the halogen is fluorine, wherein the metal oxide is titanium oxide $TiO_x$ (1<x<2), wherein the metal oxide is in the form of a thin film, wherein the thin film metal oxide is doped after deposition by plasma treatment, wherein the thin film metal oxide is doped during deposition by magnetron sputtering in the presence of the dopant or in the presence of a precursor molecule containing the dopant, wherein the metal oxide is in the form of a mesoporous structure, wherein the metal oxide is doped after synthesis of the mesoporous structure, wherein the metal oxide is doped during synthesis of the mesoporous structure by synthesizing the mesoporous metal oxide in the presence of the dopant or in the presence of a precursor molecule containing the dopant, wherein the metal oxide acts as the catalyst, wherein the metal oxide acts as a chemically and/or electronically active support for the metal catalyst, wherein the metal catalyst is platinum, wherein the metal catalyst is in the form of nanoparticles, wherein the metal catalyst is in the form of a thin film, wherein the thin film is discontinuous such that the metal oxide is exposed, wherein the reaction to be catalyzed is an electrochemical reaction, wherein the electrochemical reaction is $H_2$ and/or $O_2$ evolution from water, wherein the electrochemical reaction is reduction of $CO_2$, wherein the purpose of the dopant in the metal oxide is to reduce the overpotential required for the electrochemical reaction, wherein the purpose of the dopant in the metal oxide is to increase the rate of the catalytic reaction, wherein the reaction to be catalyzed is an oxidation reaction, wherein the purpose of the dopant is to increase the rate of the catalytic oxidation reaction, wherein the reaction to be catalyzed is a multipath reaction, wherein the purpose of the dopant is to alter the selectivity of the multipath reaction, wherein the multipath reaction is an oxidation reaction, wherein the purpose of the dopant in the metal oxide is to increase the selectivity toward a partially oxidized product, wherein the reaction is an oxidation of an alcohol and the purpose of the dopant in the metal oxide is to increase the selectivity toward an aldehyde, wherein the reaction is an oxidation of $H_2$ and the purpose of the dopant in the metal oxide is to increase the selectivity toward a peroxide, wherein the reaction is an oxidation of an alkene and the purpose of the dopant in the metal oxide is to increase the selectivity toward an epoxide.

In one embodiment, a catalytic solid state device is described comprising a doped metal oxide with a metal catalyst formed thereon, operative to produce a charge transport channel; a gate bias circuitry operative to bias the charge transport channel to generate an electric field at the surface of the metal catalyst to allow for external control of a catalyzed chemical reaction.

The catalytic solid state device wherein the dopant in the metal oxide is a halogen, wherein the halogen is fluorine, wherein the metal oxide is titanium oxide $TiO_x$ (1<x<2), wherein the metal oxide is in the form of a thin film, wherein the thin film metal oxide is doped after deposition by plasma treatment, wherein the thin film metal oxide is doped during deposition by magnetron sputtering in the presence of the dopant or in the presence of a precursor molecule containing the dopant, wherein the metal oxide is in the form of a mesoporous structure, wherein the metal oxide is doped after synthesis of the mesoporous structure, wherein the metal oxide is doped during synthesis of the mesoporous structure by synthesizing the mesoporous metal oxide in the presence of the dopant or in the presence of a precursor molecule containing the dopant, wherein the metal oxide acts as the catalyst, wherein the metal oxide acts as a chemically and/or electronically active support for the metal catalyst, wherein the metal catalyst is platinum, wherein the metal catalyst is in the form of nanoparticles, wherein the metal catalyst is in the form of a thin film, wherein the thin film is discontinuous such that the metal oxide is exposed, wherein the reaction to be catalyzed is an electrochemical reaction, wherein the electrochemical reaction is $H_2$ and/or $O_2$ evolution from water, wherein the electrochemical reaction is reduction of CO2, wherein the purpose of the dopant in the metal oxide is to reduce the over-potential required for the electrochemical reaction, wherein the purpose of the dopant in the metal oxide is to increase the rate of the catalytic reaction, wherein the reaction to be catalyzed is an oxidation reaction, wherein the purpose of the dopant is to increase the rate of the catalytic oxidation reaction, wherein the reaction to be catalyzed is a multipath reaction, wherein the purpose of the dopant is to alter the selectivity of the multipath reaction, wherein the multipath reaction is an oxidation reaction, wherein the purpose of the dopant in the metal oxide is to increase the selectivity toward a partially oxidized product, wherein the reaction is an oxidation of an alcohol and the purpose of the dopant in the metal oxide is to increase the selectivity toward an aldehyde, wherein the reaction is an oxidation of $H_2$ and the purpose of the dopant in the metal oxide is to increase the selectivity toward a peroxide, wherein the reaction is an oxidation of an alkene and the purpose of the dopant in the metal oxide is to increase the selectivity toward an epoxide.

BRIEF DESCRIPTION OF THE DRAWINGS

The foregoing aspects and others will be readily appreciated by the skilled artisan from the following description of illustrative embodiments when read in conjunction with the accompanying drawings.

FIG. 5A depicts a metal oxide semiconductor field effect transistor (MOSFET) gate stack combined with a resistive oxide switching memory cell, and FIG. 5B depicts a transparent thin film transistor.

DETAILED DESCRIPTION

In the discussions that follow, various process steps are described using certain types of manufacturing equipment, along with certain process parameters. It is to be appreciated that other types of equipment can be used, with different pressure and gas concentrations employed, and that some of the steps may be performed in the same chamber without departing from the scope of this invention. Furthermore, different component gases could be substituted for those described herein without departing from the scope of the invention. What is important is that after formation of the TMO film, which will inherently contain O vacancies, the film is further treated in an atmosphere containing F under such conditions as to cause the insertion of fluorine into the deposited film. In one embodiment, especially where a pure transition metal target is used, prior to F insertion, the as-deposited film is first exposed to an oxygen containing atmosphere to reduce the number of O vacancies, in the preferred case to the stoichiometric state.

These and other details and advantages of the present invention will become more fully apparent from the following description taken in conjunction with the accompanying drawings.

In the present invention, a plasma assisted fluorine insertion is used to passivate defects in the transition metal oxide semiconductor, and act as an extrinsic n-type donor. In experiments performed to date with titanium oxide, electrical analysis has shown that F insertion is an excellent way to achieve highly conductive, low defect titanium oxides suitable for many TMO device applications.

The F Insertion Process

Figure 1:
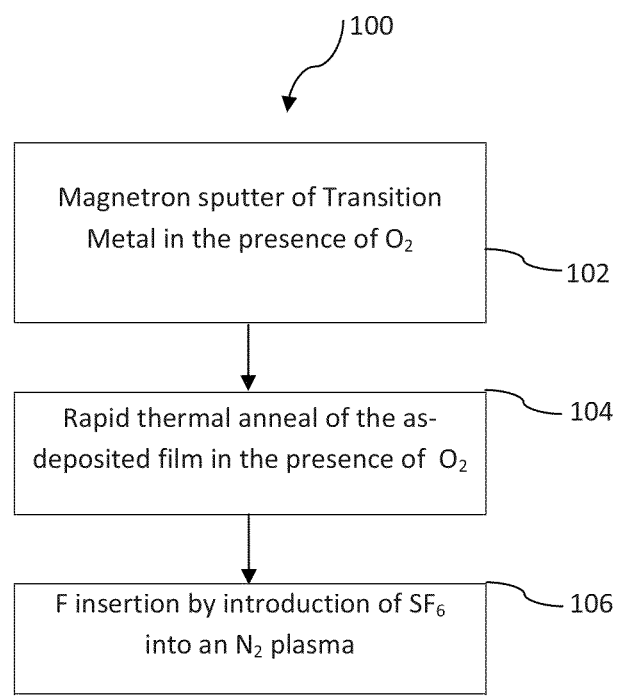
FIG. 1 is a flow chart showing a process by which F insertion into a TMO film can be achieved.

With reference to FIG. 1, the first step in process 100 is the formation of a $TiO_x$ film upon a suitable substrate, the selection of the substrate dependent upon the ultimate application for the to-be-formed film. For example, for titanium oxide, where the formed film in inherently transparent, the supporting substrate may well be glass, or a flexible polymer base for flat screen applications. In the case again of a semiconducting $TiO_2$, the oxide can also be used in the formation of semiconductor devices (e.g., resistive oxide switching memory) on such traditional substrate supports as silicon, or a silicon wafer having a stabilizing oxide or epitaxial layer, etc.

Typically these films are formed by a plasma deposition of the transition metal oxide onto the substrate in a plasma chamber. In one embodiment this is achieved using a direct current (DC) magnetron sputtering chamber in which a metal target is placed in a chamber, a neutral gas introduced, and by application of energy to the system, such as by use of an induction RF coil, a plasma is generated. In the process, metal atoms of the target are sputtered from the target surface, and due to the differences in potential between the ions in the plasma and the substrate, the ions are drawn to the substrate, the greater the process time, the thicker the deposited film.

In order to deposit a TMO film, the reactive ion etch magnetron sputtering step 102 is carried out at low pressures in the order of $10^{-6}$~$10^{-7}$ Torr in the presence of oxygen ($O_2$). In the sputtering process, TM ions react with oxygen in the plasma to chemically form oxygen-deficient TMO, which material is deposited onto the substrate. In the discussion to follow, reference is made to titanium and to $TiO_x$. It is to be appreciated that other transition metals can be used in the same manner, though the operating parameters needed may change dependent upon the transition metal being used, the required adjustments considered within the skill of the art.

In the case of titanium, the target material used in the experiments was supplied by Super Conductor Materials, Inc, and was 99.99% pure. (It is to be appreciated that the target material can also be an oxygen containing metal compound such as $TiO_2$, in which case the as-deposited film will contain more oxygen atoms, though still have O vacancies.) The target was mounted in a home-made chamber. The bias applied to the target was 450 V, the plasma power was 400 W. Argon gas was used to generate the plasma, the Ar flow set at 50 SCCM. Limited amounts of oxygen gas were introduced as well, the $O_2$ flow set at 3 SCCM. Two different film thicknesses and substrates were used: 100 nm films deposited on an insulating substrate [i.e., a thermally grown 500 nm $SiO_2$ film on a Si wafer] and 10 nm films deposited on highly doped (0.01-0.02 Ω·cm) p-type Si (100) with native oxide. The substrates were maintained at ground. Processing times were about in the order of 30 seconds for the 10 nm films and in the order of 10 min for the 100 nm films. As deposited, the titanium oxide films were highly O deficient at 1.7 of the stoichiometric O/Ti ratio.

In step 104 the oxygen vacancy rate is tuned by subjecting the substrate to a rapid thermal annealing in the presence of $O_2$ at various conditions. In the experiments involving Ti, a rapid thermal annealing chamber, the Heatpulse 210T supplied by AG Associates was used. Three pre-conditions were prepared for F insertion with sub-oxide concentrations ranging from 41% to <3% (measured as the ratio of $Ti^{4+}$ to $Ti^{3+}$ peak areas in the Ti2p XPS spectrum (as depicted if FIG. 4c). To achieve this distribution of sub-oxide concentrations, all samples were first annealed in $N_2$ at 500° C. to increase crystallinity. In this step, nitrogen was introduced into the chamber for about 10 minutes to first purge the chamber prior to RTA. Following RTA (rapid thermal anneal) in $N_2$, annealing in $O_2$ at different temperatures, was conducted, oxygen was first introduced for a period of time to purge the chamber of nitrogen, anneal in an oxygen atmosphere serving to increase the O stoichiometry in the film. Without the presence of $O_2$ annealing, films were produced with 41% sub-oxide. RTA in $O_2$ at 350° C. produced films with 8% sub-oxide; and RTA in $O_2$ at 500° C. produced films with <3% sub-oxide. (Anneal times were in the range of 1 to 2 minutes.) It should be noted that the actual stoichiometries varied from one deposition to another. Also, even for $TiO_2$, there remained a low level of vacancies, in the order of 2-3%, with fluorine going to $O_2$ vacancies. Consequently, all results reported herein were taken from a single deposition. Although exact values varied, the trends reported are consistent between depositions.

In step 106, F insertion was achieved using a RF plasma chamber (an oxide rainbow etch chamber supplied by Lam Research) by plasma treatment using $N_2$ gas with trace amounts of $SF_6$. Trace $SF_6$ was introduced into the chamber by flowing a 9:1 mixture of $SF_6$ and $O_2$ followed by pumping the chamber to a base pressure of about 5 m Torr. After pumping, a small background pressure of $SF_6$ remained in the chamber. $N_2$ gas was then introduced at 80 SCCM for plasma treatment. Plasma power was 20 W with 130 V DC substrate bias. F concentration is tunable by control of the length of the plasma treatment.

X-ray photoelectron spectroscopy (XPS) was used to analyze the chemical binding states and valence band edge of the titanium oxide films (Physical Electronics, PHI 5400 ESCA/XPS system with an Al anode source at 1486.6 eV). The energy resolution for each point is 0.05 eV. The analyzer was positioned at 50 degrees relative to sample normal. All binding energies were calibrated to the C1s peak state.

Two types of electrical measurements were made. First, current-voltage (IV) curves were measured for 10 nm titanium oxide films on highly doped p-Si. Second, surface resistivity was measured for 100 nm titanium oxide films on insulating supports. Ohmic contact was made to the titanium oxide using thin film electrodes consisting of 10 nm Ti and 100 nm Au. For the $TiO_2$/p-Si hetero junction devices, ohmic contact was made to the backside of p-Si with 30 nm Pt. All metals were deposited by electron beam evaporation. Measurements were made with a Keithley 2400 source meter.

Results

Figure 2:
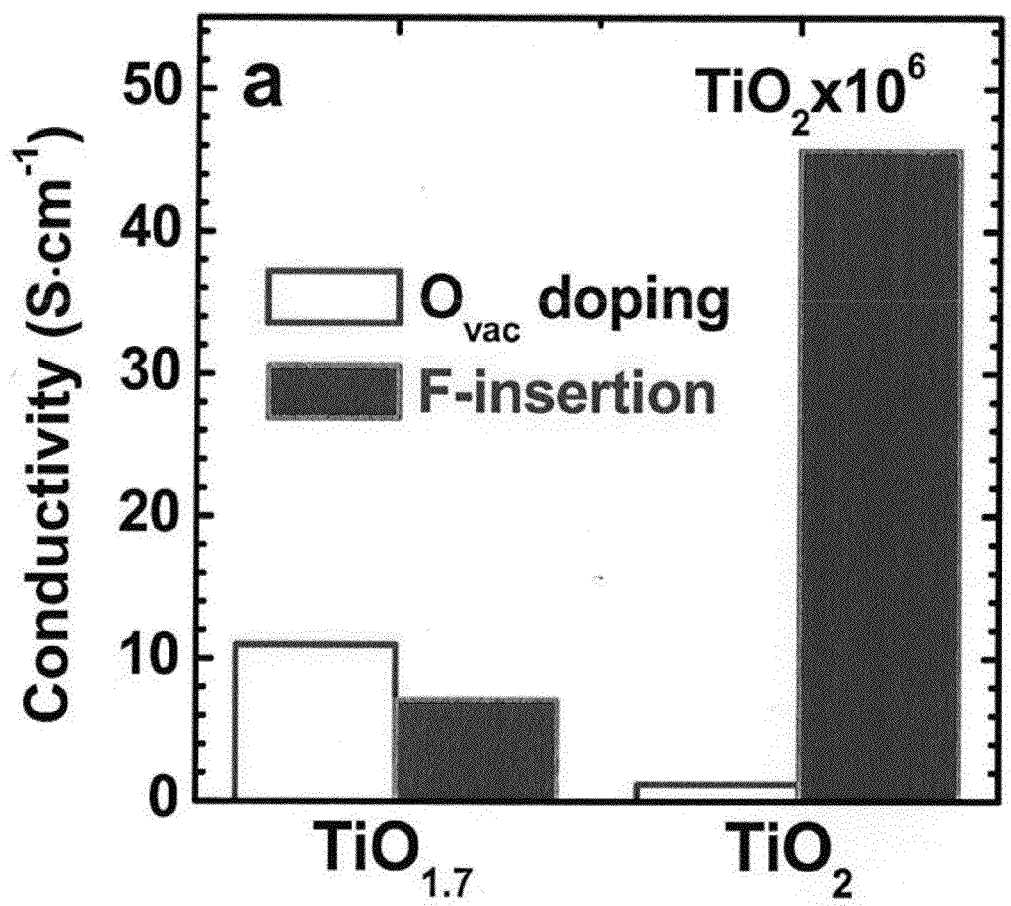
FIG. 2 is a bar chart depicting conductivity measurements at room temperature for 100 nm TiOx on an insulating substrate.

With reference now to FIG. 2, conductivity was plotted at room temperature for the 100 nm $TiO_x$ film on an insulating substrate (i.e. a thermally grown 500 nm $SiO_2$ film on Si wafer). As can be seen from the chart for $TiO_{1.7}$ which contains a significant amount of O vacancies, when subject to F insertion, the conductivity actually drops. On the other hand, and surprisingly so, for stoichiometric $TiO_2$, after F insertion, conductivity increased by nearly a factor of 40 (considering the actual surface channel area, this factor can be up to $10^2$) for the more chemically stable form of $TiO_x$. Without wishing to be bound by the following explanation, it is believed that for $TiO_{1.7}$, F insertion slightly decreases conductivity by removing the suboxide states that provide the primary path for charge transport. For $TiO_2$, F insertion increases conductivity as shown in FIG. 2, and shows activation energy $E_a$ consistent with conduction band (CB) transport. Thus while F decreases suboxide transport, resulting experimental data suggests it produces a surface channel for enhanced CB transport.

Figure 3:
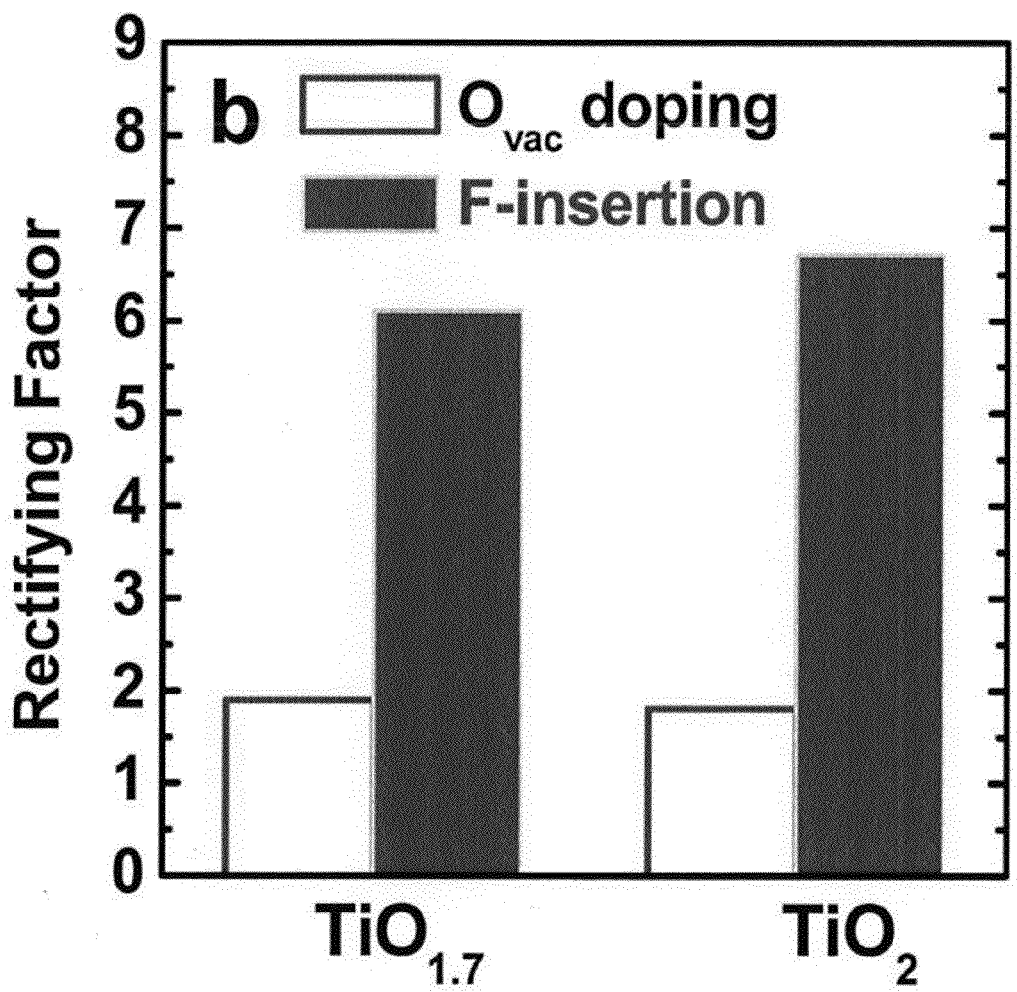
FIG. 3 is a bar chart showing rectifying factor for both $TiO_2$ and $TiO_{1.7}$ both before and after F insertion.

Turning now to FIG. 3, a plot of the Rectifying Factor for $TiO_{1.7}$ and $TiO_2$, before and after F insertion. Rectifying factors are the ratio of forward to reverse bias current. For O vacancy doped $TiO_x$, low rectifying factors are the result of a high concentration of defect states and low Fermi level ($E_F$). By passivating defects and raising $E_F$, F doping increases the rectifying factor for each precondition, as illustrated, by more than a factor of 3.

Figure 4:
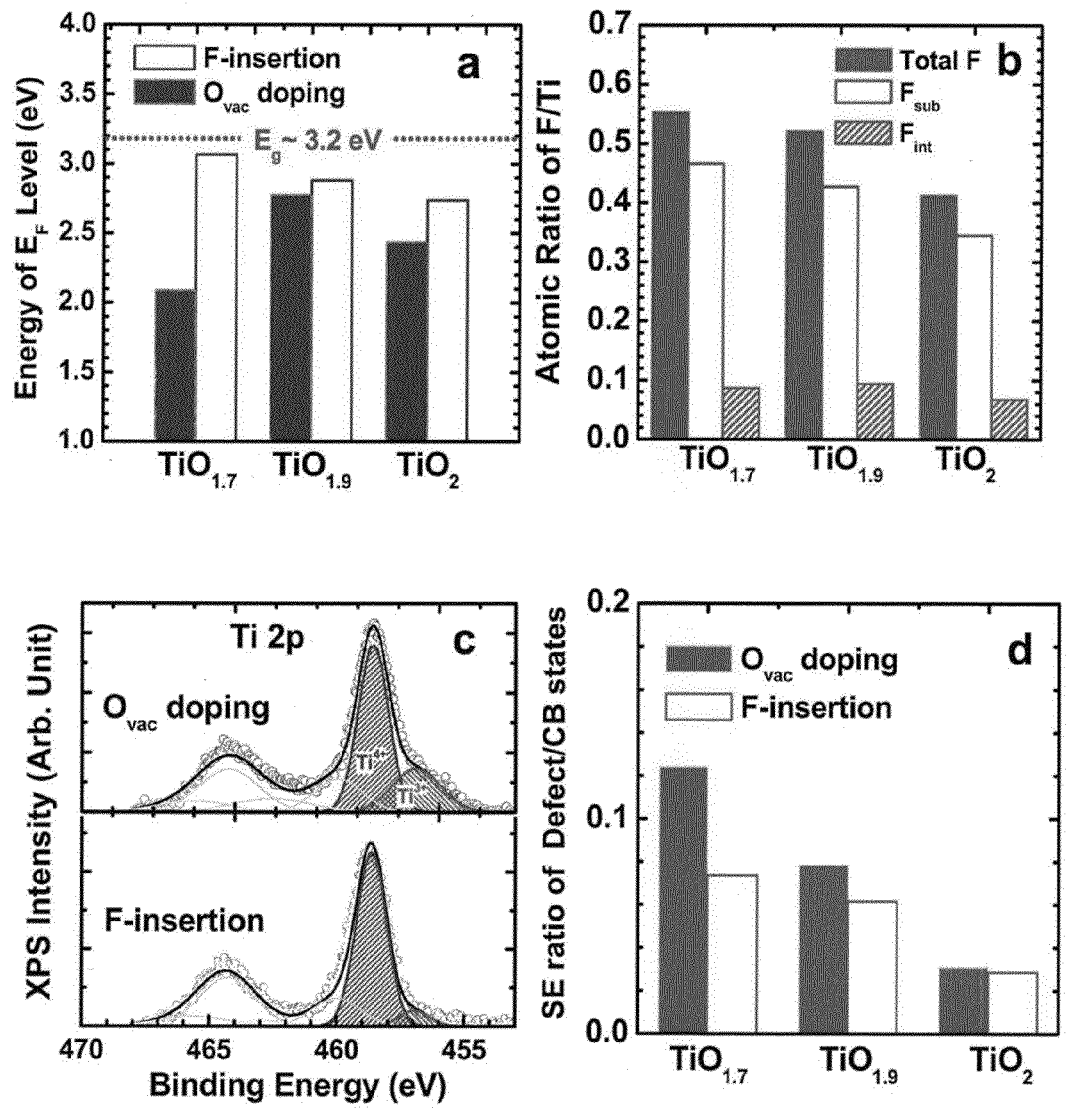
FIG. 4a is a bar chart illustrating the effect on Fermi Energy level $E_f$ for various $TiO_x$ compositions, both before and after F insertion.
FIG. 4b is a bar chart comparing the atomic ratio of F/Ti for these same $TiO_x$ compositions after F insertion.
FIG. 4c is a bar chart showing the spectroscopic ellipsometry (SE) determined ratio of defect/CB states of the same $TiO_x$ compositions both before and after F insertion.

In FIG. 4a Fermi level ($E_F$) before and after F insertion is plotted for each $TiO_x$ precondition determined by fits to the valance band edge XPS spectra. For the O vacancy doped samples, $E_F$ is determined by Fermi pinning to O vacancy defect states. By passivating O vacancy states, F removes the effects of Fermi pinning. Additionally, F acts as an extrinsic n-type donor. As a result, F insertion raises $E_F$ higher than is possible by O vacancy doping alone (e.g. via the introduction of oxygen during RTA) which stems from the O deficiency or equivalently, the $Ti^{3+}$ species in $TiO_x$. For the doped samples, $E_F$ scales with F concentration.

In FIG. 4b, the atomic ratio of F to Ti after 3 minutes of plasma treatment for each $TiO_x$ precondition is plotted. Atomic ratios are shown for two different binding states identified by XPS and for total F. These two binding states were defined as F substituted for O ($F_{sub}$) and as interstitial F ($F_{int}$). Substitutional F concentration depends strongly on the initial O vacancy concentration before plasma treatment and appears to determine $E_F$ after F insertion.

Lastly, in FIG. 4d, the ratio of defect state to CB absorption measured by spectroscopic ellipsometry before and after F insertion for $TiO_{1.7}$, $TiO_{1.9}$, and $TiO_2$ is plotted. Defect state/CB absorption was taken as the maximum absorption coefficient below/above 3.2 eV. The trend shows that F passivates O vacancies that give rise to defect states.

In these experiments, conduction was measured at the surface of the deposited film after F insertion. It is contemplated that greater insertion at depth can be obtained by increasing the bias to the substrate relative to the plasma. In another embodiment, it is contemplated that trace amounts of fluorine can be introduced in the first magnetron sputtering step where the TMO film is first formed such that the fluorine is introduced into the film as it is being formed. In yet another embodiment, thick films can be produced sequentially, such that a thin layer of O-deficient TMO is formed to a depth D, subject to RTA in the presence of oxygen, and then F plasma inserted, the process repeated n number of times until a film of (n)D thickness if formed, in this manner obtaining uniformly increased conductivity throughout the film bulk. In still another embodiment, a stoichiometic $TiO_2$ target can be used in magnetron sputter step 102, in which case the as-deposited content of oxygen in the film would be higher, such as $TiO_{1.9}$ or more, the finally formed film subject to subsequent oxygen doping, as required.

Above has been described a method of increasing the conductivity of TMO films while maintaining stability, using F insertion achieved by treatment of the film with an $N_2$ plasma containing trace amounts of SF6. Previous reports by others have described wet methods for F insertion into metal oxides. However, these reports have not described the effect of F on the electronic structure. That is, the effect of F on the electronic properties of metal oxides was not previously known or explored. Addition, the present method distinguishes from the previous methods because F insertion occurs by dry processing, meaning that the metal oxide is never exposed to wet solution. Dry processing is desirable over wet methods for treatment of charge based devices because exposure to water leads to degradation of the metal oxide surface resulting in device reliability issues.

Analysis of titanium oxide following F insertion shows that F insertion (1) passivates O vacancy defects, (2) increases the Fermi level, (3) increases conduction band transport, and (4) increases rectification of titanium oxide on p-type silicon. The combined effects promise to greatly increase the utility of metal oxides for charge transport/transfer applications.

Figure 5:
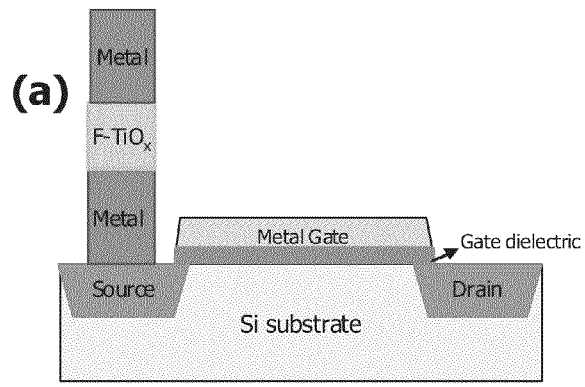
FIGS. 5A and 5B are representational schematic cross sections illustrative of semiconductor devices that can be fabricated using the processes of this invention.
Figure 5:
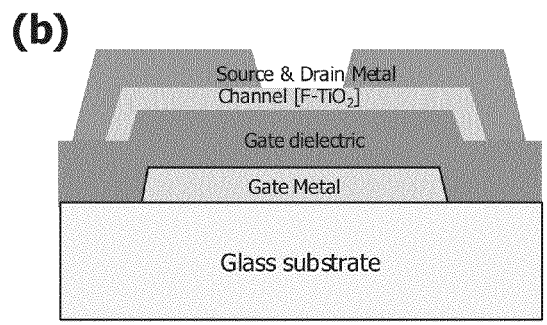

With reference now to FIG. 5, representative arrangements of a MOSFET gate stack with a resistive memory cells (5A) and a TFT gate stack on glass (5B) are illustrated by way of example to show how the novel materials of this invention may be employed. It of course should be clear that other types or arrangements of gate stacks may be used which employ the TMO semiconducting materials of the invention, without department from the scope of the invention.

It is projected that the modified TMO films of this invention will have utility in many applications, a sampling of which is listed below:

Transparent Thin Film Transistors—Because of the high surface charge density achieved by F insertion, this processing can be applied for transparent thin film transistors.

Resistive Oxide Memory—The use of TMOs for resistive oxide switching random access memory (ReRAM) requires highly n-type TMO for rectification to p-type silicon. It has already been demonstrated that F insertion improves rectification of titanium oxide to p-type silicon, making this an attractive application for F insertion.

Field Effect Transistors—Owing to the strong binding energy between F and transition metals, F insertion can be used for chemical passivation to improve the chemical stability in many device applications. A critical example of this application is the interface between high-k gate dielectrics and semiconductor surfaces/metal gate electrodes in the gate stack of metal oxide semiconductor field effect transistors (MOSFET). Typically, these oxide interfaces suffer from the serious chemical mixing across several nanometers, which causes fatal reliability issues. F insertion in these oxide interfaces likely improves chemical stability, enhancing the reliability of advanced electronic devices in integrated circuits of memory, central process unit, and radio frequency devices.

Photovoltaic Cells—In many heterogeneous solar cells, TMO semiconductors (e.g., $TiO_2$) serve as an electron transport channel. The defect/surface-state free junction between $TiO_2$ and the active absorbing layer (e.g., dye materials) is important to increase solar power generation. F insertion is ideal for this application because it increases electron transport efficiency and interface potential to maximize the solar power generation. Consequently, F insertion is likely to improve the efficiency of heterogeneous solar cells.

Photocatalysts—Photocatalysis, including water splitting, on TMO semiconductors often suffers from charge trapping at O vacancy defects. O vacancy defects have less energy than the true TMO bandgap, so charge trapping results in a loss of carrier energy and decreased photocatalytic efficiency. Because F insertion passivates O vacancy defects, it enables oxide catalysts to utilize the full bandgap energy and increase the efficiency of photo-catalyzed reactions.

Catalysts—Because of high surface charge density associated with F insertion, this can be applied for the oxide or oxide-supported catalyst. Many important reactions are promoted by electronic interactions between a metal catalyst and an oxide support. Embodiments of the invention have demonstrated the ability of F insertion to increase the rate of CO oxidation, an environmentally important reaction.

Chemical Sensors—Because F insertion affects both surface reactivity and surface conductivity, it is likely to find application in chemical sensors.

Ultra-violet Optical Detectors—Because F insertion can tune the Fermi level of a TMO without modifying the bandgap, F insertion can be used to fabrication optical detectors that are highly selective for ultra-violet radiation.

Chemical Reactions Catalyzed by Metal Particles on an Oxide Support

The role of the oxide-metal interface in determining the activity and selectivity of chemical reactions catalyzed by metal particles on an oxide support is an important topic in science and industry. A proposed mechanism for this strong metal-support interaction is electronic activation of surface adsorbates by charge carriers. Motivated by the goal of using electronic activation to drive non-thermal chemistry, embodiments of the invention investigate the ability of the oxide support to mediate charge transfer. Embodiments of the invention describe an approximately twofold increase in the turnover rate of catalytic carbon monoxide (CO) oxidation on platinum (Pt) nanoparticles supported on stoichiometric titanium dioxide ($TiO_2$) when the $TiO_2$ is made highly n-type by fluorine (F) doping. However, for non-stoichiometric titanium oxide ($TiO_{X<2}$) the effect of F on the turnover rate is negligible. Studies of the titanium oxide electronic structure show that the energy of free electrons in the oxide determines the rate of reaction. These results suggest that highly n-type $TiO_2$ electronically activates adsorbed oxygen (O) by electron spillover to form an active $O^-$ intermediate.

Although metals alone are often catalytically active, most industrial catalysts consist of metal particles supported on a porous oxide. This not only provides a high surface area for the heterogeneous catalyst, but as shown by many studies, the oxide support plays an important role in determining the activity and selectivity of the catalyst. For example, catalytic activation occurs "by a transition of electrons from the substrate to the metallic catalyst." (Schwab, G. M. *Transactions of the Faraday Society* 1946, 42, 689.) In some cases of "small metal particles dispersed on inorganic oxides," electron transfer from the oxide to the metal particles "leads to profound changes in the [catalytic properties] of the metal particles." (Tauster, S. J.; Fung, S. C.; Baker, R. T. K.; Horsley, J. A. *Science* 1981, 211, 1121.)

This phenomenon, known as the strong metal-support interaction (SMSI), has been widely studied and is an important topic in both science and industry. For example,"when metals are dispersed on titania or similar substrates, the onset of the strong metal-support interaction convulses the system." (Tauster, S. J. *Accounts of Chemical Research* 1987, 20, 389.)

SMSI affects a wide range of catalytic reactions, including carbon monoxide (CO) and carbon dioxide ($CO_2$) hydrogenation (see Boffa, A.; Lin, C.; Bell, A. T.; Somorjai, G. A. *Journal of Catalysis* 1994, 149, 149. Vannice, M. A.; Sen, B. *Journal of Catalysis* 1989, 115, 65.), selective hydrogenation (see Lin, S. D.; Sanders, D. K.; Albert Vannice, M. *Applied Catalysis A: General* 1994, 113, 59. Malathi, R.; Viswanath, R. P. *Applied Catalysis A: General* 2001, 208, 323.), and CO oxidation (see Oh, S. H.; Eickel, C. C. *Journal of Catalysis* 1988, 112, 543. Zhu, H.; Qin, Z.; Shan, W.; Shen, W.; Wang, J. *Journal of Catalysis* 2004, 225, 267. Chen, M. S.; Goodman, D. W. *Science* 2004, 306, 252. Goodman, D. *Catalysis Letters* 2005, 99, 1.)

Although not traditionally termed SMSI, the catalyst support also plays an important role in activating molecular oxygen for selective partial oxidation reactions. Industrially relevant examples include the synthesis of aldehydes from primary alcohols, the production of hydrogen peroxide from hydrogen, and the conversion of methane to synthesis gas. In all of these cases, molecular oxygen is preferred over other oxygen donors due to cost, energy efficiency, and environmental concerns.

Titanium oxide is perhaps the best known example of an SMSI support. $TiO_2$ has been shown to support catalytic activity "nickel deposited on titanium oxide is orders of magnitude more active . . . than the pure, unsupported nickel catalyst." (Somorjai, G. A.; Li, Y. *Introduction to surface chemistry and catalysis*, 2nd Edition ed.; Johns Wiley & Sons, Inc.: Hoboken, N.J., 2010.)

Additionally, titanium oxide is a common support for catalysts demonstrating high selectivity toward partial oxidation (see Enache, D. I.; Edwards, J. K.; Landon, P.; Solsona-Espriu, B.; Carley, A. F.; Herzing, A. A.; Watanabe, M.; Kiely, C. J.; Knight, D. W.; Hutchings, G. J. *Science* 2006, 311, 362. Edwards, J. K.; Solsona, B. E.; Landon, P.; Carley, A. F.; Herzing, A.; Kiely, C. J.; Hutchings, G. J. *Journal of Catalysis* 2005, 236, 69. Nakagawa, K.; Ikenaga, N.; Suzuki, T.; Kobayashi, T.; Haruta, M. *Applied Catalysis A: General* 1998, 169, 281.)

The majority of proposed mechanisms for the role of titanium oxide fall into one of the following categories: (1) formation of active sites when the support wets (or "decorates") the metal particle, (2) oxygen (O) activation and/or spillover from chemically active defects in the support, and (3) electronic mediation through various forms of charge transfer. Although each of these mechanisms can play an important role, this study focuses on the role of charge transfer and electronic mediation due to its importance in energy conversion reactions.

Previous studies have indicated that, at least in certain instances, catalytic oxidation reactions proceed by an electronically activated pathway. Bonn et al. showed that for CO oxidation on Ru, the activation of chemisorbed O occurs by charge transfer from the metal (Bonn, M.; Funk, S.; Hess, C.; Denzler, D. N.; Stampfl, C.; Scheffler, M.; Wolf, M.; Ertl, G. *Science* 1999, 285, 1042.)

Because the active O species cannot form thermally until well above the desorption temperature of CO, a temperature ramp of a $CO/O_2$ co-adsorbed Ru surface produces CO and $O_2$, but not $CO_2$. However, a femtosecond laser pulse can produce very high electronic temperatures on the short time scale without significant lattice heating. This serves to activate the O without CO desorption, resulting in $CO_2$ formation.

Although fundamentally insightful, this type of experiment employing a femtosecond laser cannot be scaled for high turnover applications. Another approach to achieve electronic activation is to use an electronically modified catalyst. Several variables can tune the electronic structure of a catalyst including size, support, and doping. The objective of embodiments of the invention was to identify the role of the support in electronic activation of surface chemistry. Embodiments of the invention describe the ability to modify the electron transport properties of titanium oxide by controlling the O stoichiometry and by fluorine (F) doping.

Embodiments of the invention describe that stoichiometric titanium dioxide ($TiO_2$) modified by F doping is an electronically active support for CO oxidation on platinum (Pt) under conditions of high pressure and temperature (760 Torr and 443 K). However, the highly conductive reduced oxide shows little or no electronic activity toward CO oxidation, with or without F.

It has been well documented that Platinum (Pt) serves as an excellent supported metal catalyst (see Tauster, S. J.; Fung, S. C.; Baker, R. T. K.; Horsley, J. A. *Science* 1981, 211, 1121. Tauster, S. J. *Accounts of Chemical Research* 1987, 20, 389. Kijenski, J., Winiarek, P., Paryjczak, T., Lewicki, A. & Mikolajska, A. Platinum deposited on monolayer supports in selective hydrogenation of furfural to furfuryl alcohol. *Applied Catalysis A: General* 233, 171-182, (2002).)

We have previously reported the production of hot electron flow during catalytic CO oxidation using the $Pt/TiO_2$ nanodiode system (Park, J. Y.; Somorjai, G. A. *Chemphyschem* 2006, 7, 1409.) In that work we demonstrated that there is an electron flow from the Pt to the $TiO_2$ in proportion to the catalytic turnover. Embodiments of the invention describe that the opposite effect occurs by F doping $TiO_2$. In this case, an electron flow from the titanium oxide to the surface adsorbates significantly increases the catalytic reaction rate by activating surface O for reaction with CO.

Catalyst Preparation

Figure 6:
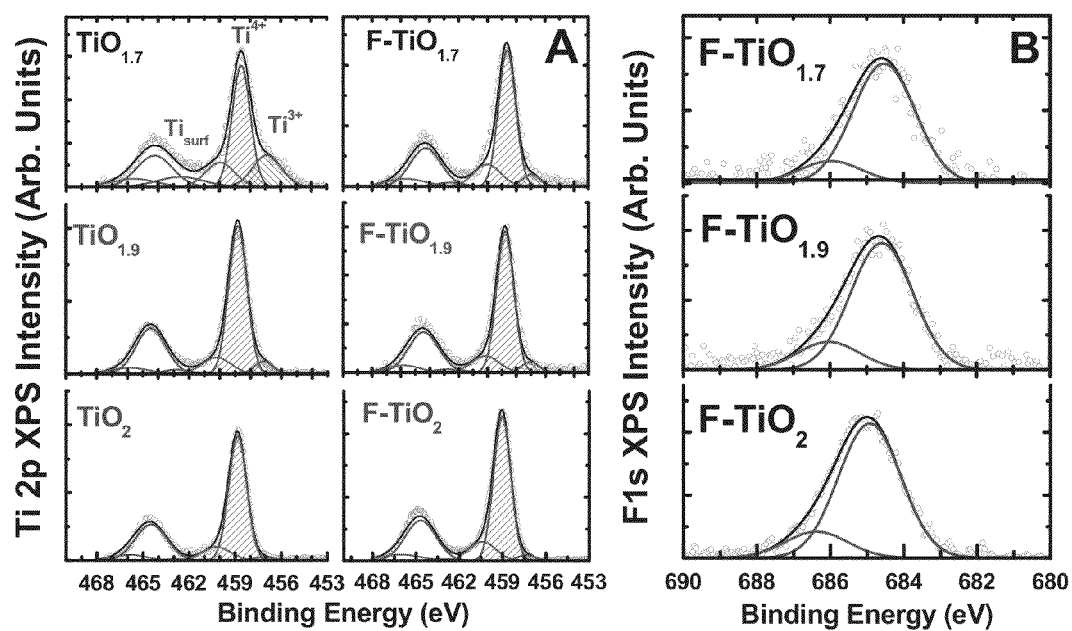
FIGS. 6A and 6B illustrate Ti 2p and F 1s X-Ray Photoelectron Spectra of Titanium Oxide Supports.

Thin films of titanium oxide with variable oxygen (O) vacancy concentrations served as supports for the platinum (Pt) catalyst. First, titanium oxide films (100 nm) were deposited on Si(100) wafers with a 500-nm-thick thermal oxide by direct-current magnetron sputtering. Sputtering conditions were 400 W plasma power, 450 V bias voltage, 50 sccm Ar flow, and 3 sccm $O_2$ flow. As deposited, the titanium oxide films were highly O deficient. Rapid thermal annealing in $O_2$ at temperatures between 623 and 773 K was used to vary the O concentration in the films. To avoid grain size variations due to annealing at different temperatures, all samples were annealed in nitrogen ($N_2$) at 773 K. Titanium oxide films with three stoichiometries were prepared: $TiO_2$, $TiO_{1.9}$, and $TiO_{1.7}$, as determined from the ratio of $Ti^{3+}$ and $Ti^{4+}$ in the Ti 2p X-ray photoelectron spectra (XPS) shown in FIG. 6. FIG. 6A Ti 2p and FIG. 6B F 1s illustrate XPS spectra of undoped and F-doped $TiO_{1.7}$, $TiO_{1.9}$, and $TiO_2$. Open circles show raw data, and curves show results of a Gaussian deconvolution.

Fluorine (F) insertion was achieved by plasma treatment in $N_2$ gas with trace sulfur hexafluoride ($SF_6$). Trace $SF_6$ was introduced into the chamber by flowing a 9:1 mixture of $SF_6$ and $O_2$ followed by pumping to chamber base pressure (5 mTorr). After pumping, a small background pressure of $SF_6$ remained in the chamber. $N_2$ gas was then introduced at 80 sccm for plasma treatment. Plasma power was 20 W and DC substrate bias was 130 V. F concentration was tunable with the length of the plasma treatment. Two samples of each $TiO_x$ stoichiometry were fabricated, and one of each type was plasma treated. This produced six supports for subsequent Pt deposition: $TiO_2$, $TiO_{1.9}$, and $TiO_{1.7}$, each with and without F. FIG. 6B shows the F 1s XPS spectra for each of the F-doped supports. All samples were stored under a dry $N_2$ atmosphere until the reaction rate measurements.

Pt nanoparticles are known to provide a large surface to volume ratio (see Tauster, S. J.; Fung, S. C.; Baker, R. T. K.; Horsley, J. A. *Science* 1981, 211, 1121. Tauster, S. J. *Accounts of Chemical Research* 1987, 20, 389.)

Figure 7:
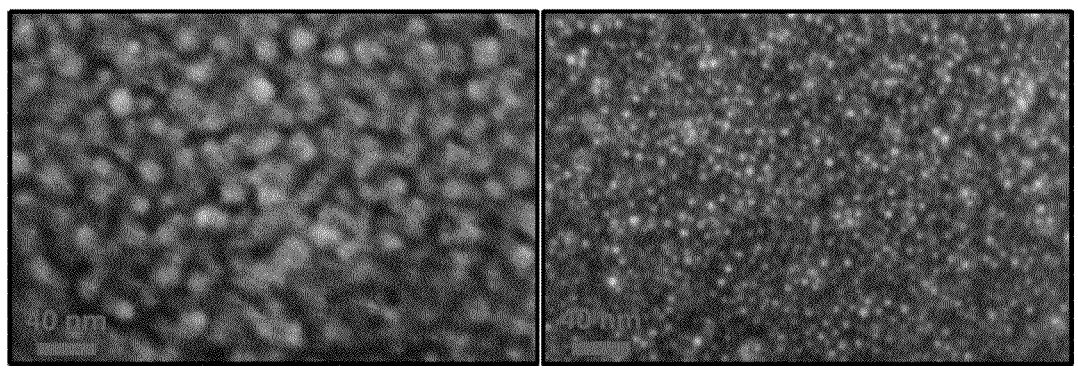
FIG. 7 illustrates a SEM of platinum (Pt) nanoparticles on Titanium Oxide.

Pt nanoparticles were deposited onto the samples by electron beam evaporation. Vapor deposited, rather than colloidally synthesized, nanoparticles were used to avoid the presence of an insulating polymer capping layer between the metal nanoparticles and the support. For electron beam evaporation the chamber base pressure was less than $10^{-5}$ Torr, and the deposition rate was 0.02 Å/s. The average film thickness monitored by quartz crystal microbalance was 1 nm. SEM showed that at this average thickness the Pt nanoparticles left ~50% of the support exposed as shown in FIG. 7. SEM micrographs of the catalyst (1 nm Pt vapor deposited on $TiO_2$) before (A) and after (B) reaction at 543 K. Although the morphology of the Pt particles exhibited some change at high temperature, the particles did not agglomerate, and the Pt coverage did not significantly change.

Catalyst Characterization

The electronic structure of the titanium oxide supports was characterized by XPS, spectroscopic ellipsometry, and measurements of surface conductivity and activation energy for charge transport.

XPS was used to analyze the chemical binding states of the titanium oxide films and the supported Pt catalysts both before and after reaction (Physical Electronics, PHI 5400 ESCA/XPS system with an Al anode source at 1486.6 eV). The analyzer was positioned at 50° relative to sample normal. All binding energies were calibrated to the Ti 2p peak state.

The real and imaginary parts of the complex dielectric constant, $\in_c = \in_1 + i\in_2$, and absorption coefficients for titanium oxide samples were determined by visible-ultra violet spectroscopic ellipsometry in a rotating compensator enhanced spectrometer. The monochromatic light source from a Xenon lamp at photon energies of 1.5-6 eV was used with spectral resolution of 15 meV.

To measure surface conductivity of the titanium oxide films, ohmic contact was made to the titanium oxide using thin film electrodes consisting of 10 nm Ti and 100 nm Au. All metals were deposited by electron beam evaporation. Measurements were made with a Keithley 2400 sourcemeter.

Reaction Rate Measurements

A batch mode reactor with a boron nitride substrate heater was used to determine the reaction rates of CO oxidation on each of the above described catalysts. A metal bellows circulation pump provided gas mixing. Gas pressures were 40 Torr CO and 100 Torr $O_2$ in a background of He. The catalyst temperature was 443 K. Each catalyst was tested for 112 min and $CO_2$ production was monitored as a function of time using a gas chromatograph with a thermal conductivity detector.

Reaction rates are reported in turnover frequency (TOF) as $CO_2$ molecules produced per Pt site per minute. All error bars represent the 95% confidence interval based on the rate of $CO_2$ production normalized to the estimated number of Pt sites. The number of Pt sites was estimated by assuming a uniform (111) surface structure over the entire catalyst area. Although this calculation is approximate, it provides a consistent normalization to the catalyst area and yields a reasonable estimate of the absolute TOF.

Results and Discussion

Figure 8:
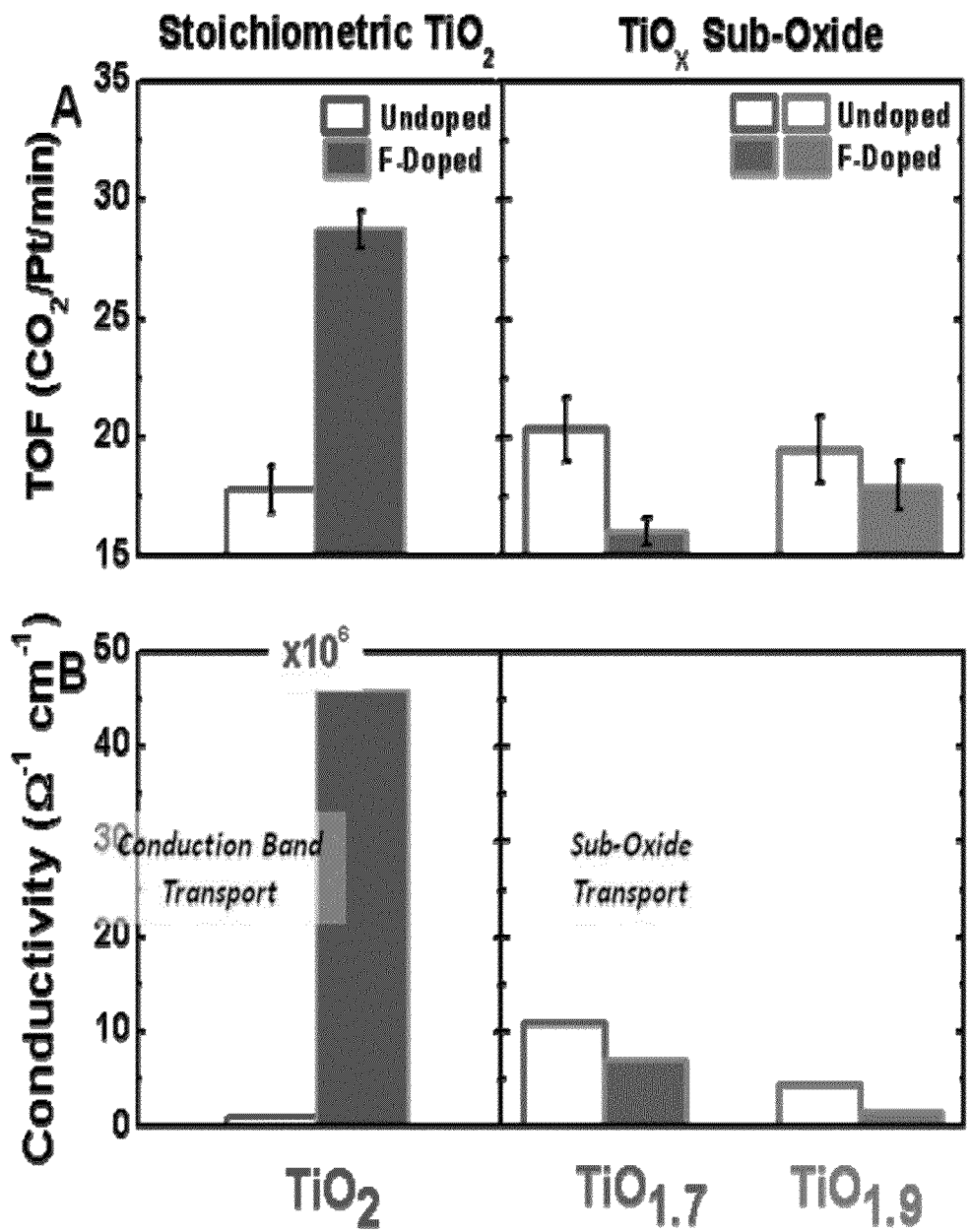
FIG. 8 illustrates the effect of F on the reaction rate and on the surface conductivity of each stoichiometry.

FIG. 8 shows the effect of F on the reaction rate and on the surface conductivity of each stoichiometry. In the case of stoichiometric $TiO_2$, F doping increased the reaction rate by 61%, while F doping to $TiO_{1.7}$ and $TiO_{1.9}$ decreased the reaction rate by 21 and 8%, respectively. There is a surprising similarity between the effect of F on the turnover rate, and the effect of F on the surface conductivity of the titanium oxide support. As in the turnover rate measurements, F doping to $TiO_2$ dramatically increased (40-fold) the surface conductivity, while F doping to $TiO_{1.7}$ and to $TiO_{1.9}$ resulted in only a slight decrease (approximately twofold) in surface conduction. Embodiments of the invention can explain these results by considering the electronic structure of stoichiometric and reduced titanium oxide. Embodiments of the invention characterize the electronic structure using two measurements: the activation energy of surface conduction and the optical absorption spectrum.

To understand how the activation energy of transport relates to the electronic structure, it is necessary to consider the role of grain boundary defects in polycrystalline $TiO_2$. Grain boundaries produce defects in the band structure of titanium oxide with a localized defect state ~0.3 eV below the conduction band edge. Consequently, this is the activation energy for conduction in polycrystalline $TiO_2$ because electrons thermally trap and de-trap at grain boundaries during transport. In contrast, O vacancies at high concentrations form a sub-oxide band structure at a reduced energy. This sub-oxide band shows semi-metal, or nearly unactivated, electron transport.

Figure 9:
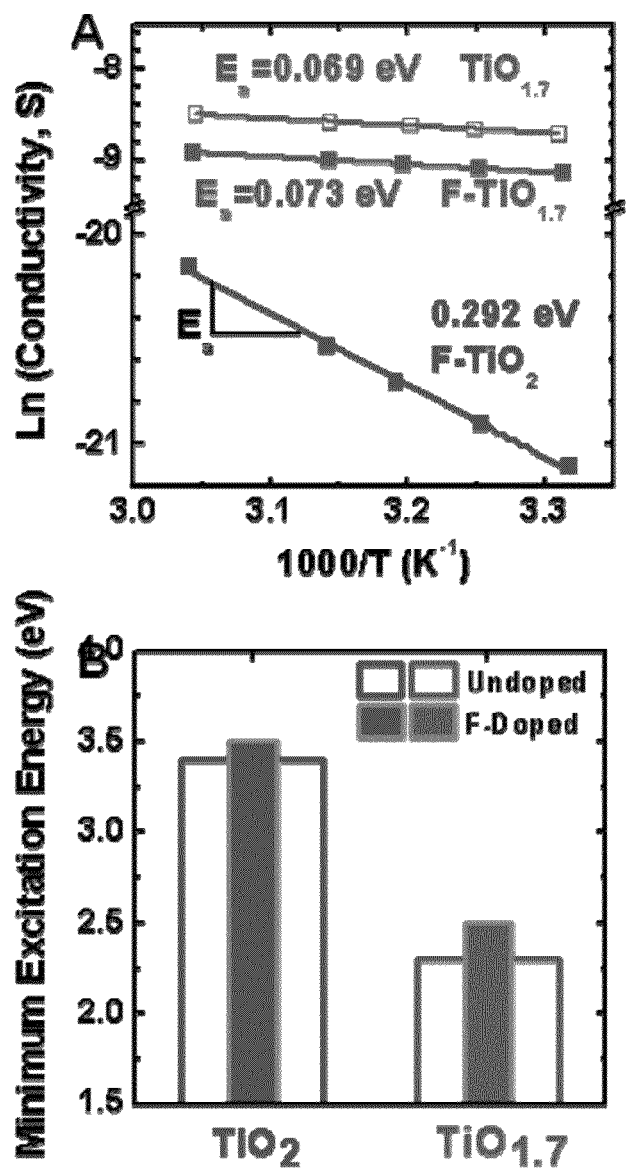
FIG. 9A illustrates the activation energies for electron transport in $TiO_{1.7}$ and $TiO_2$.
FIG. 9B illustrates the comparison of the optical absorption of $TiO_{1.7}$ and $TiO_2$.

FIG. 9A shows the activation energies ($E_a$) for electron transport in $TiO_{1.7}$ and $TiO_2$. As expected, the highly reduced oxide shows low activation energy for conduction (0.07 eV) consistent with semi-metal transport in a low energy subband, while F-doped $TiO_2$ shows activation energy of 0.29 eV, consistent with conduction band transport across grain boundaries. $TiO_2$ without F was too insulating to accurately measure the activation energy of transport. However, F insertion to $TiO_{1.7}$ did not change the transport mechanism.

Figure 10:
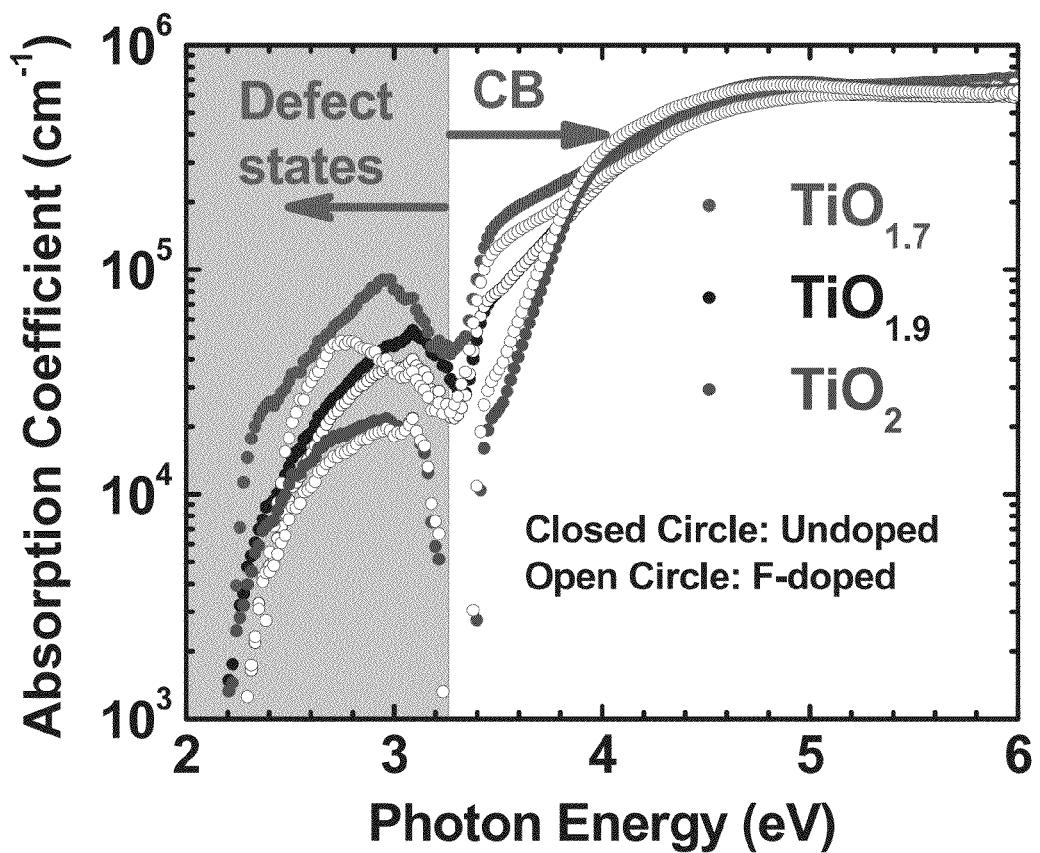
FIG. 10 illustrates the absorption coefficient spectra for Titanium Oxide supports.

FIG. 9B compares the optical absorption of $TiO_{1.7}$ and $TiO_2$. To illustrate the differences between these samples, embodiments of the invention show the minimum excitation energy having a fixed absorption coefficient of $2 \times 10^4$ cm$^{-1}$. Full spectra are shown in FIG. 10 illustrating absorption coefficient spectra for undoped and F-doped $TiO_{1.7}$, $TiO_{1.9}$, and $TiO_2$ obtained by spectroscopic ellipsometry and calculated by a three-phase analysis. Closed circles show undoped $TiO_x$, and open circles show F-doped $TiO_x$. Embodiments of the invention disclose that $TiO_{1.7}$ has a strong absorption located ~0.7 eV below the conduction band edge that arises from excitation of electron-hole pairs in the sub-oxide band. This measurement reflects the decrease in bandgap energy for the reduced oxide and shows the difference in the energy of free electrons in the two supports.

Figure 11:
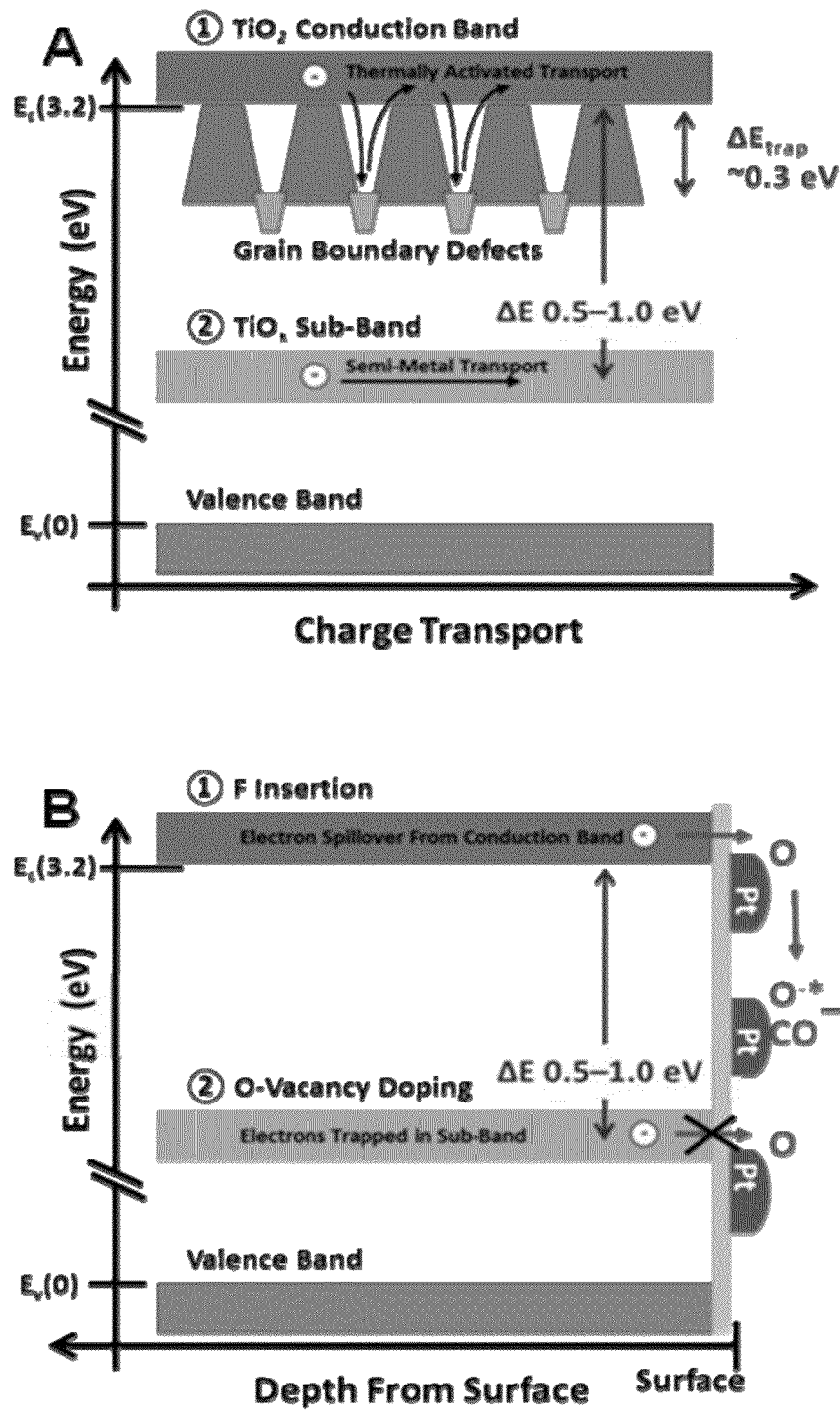
FIG. 11 is a diagram of the two band structures of stoichiometric and reduced titanium oxide.

FIG. 11A is a diagram of the two band structures of stoichiometric and reduced titanium oxide based on the above measurements. In the cases of both $TiO_{1.7}$ and $TiO_{1.9}$, F doping decreased the surface conductivity. The reason for this is that F binds to Ti at the sites of O vacancies resulting in passivation of defect states. Conduction in these samples occurs primarily in the sub-oxide band structure induced by the high concentration of O vacancies. Consequently, a decrease in the O vacancy concentration partially removes the conduction channel in these two samples. However, F insertion in the $TiO_2$ sample increased conductivity by a factor of 40. This is because F acts as an extrinsic n-type donor in metal oxide semiconductors, increasing the concentration of free electrons in the conduction band of $TiO_2$.

Assuming a reaction mechanism where the rate limiting step is activated by a conduction band electron from the titanium oxide support, the electronic structure of the titanium oxide explains the observed trend in reactivity. In the case of $TiO_{1.7}$ and $TiO_{1.9}$, the presence of F decreased the surface electron density in the oxide support resulting in a slightly reduced reaction rate. However, because the majority of electrons in these supports reside in the sub-oxide band at an energy that is presumably too low to induce chemistry, changes in electron density have a minimal effect on the reaction rate. In the case of $TiO_2$ where free carriers reside in the conduction band from which they can spillover to adsorbates, an increase of surface electron density induced by F correlates with a significant increase in catalytic activity by electronic activation.

Embodiments of the invention disclose that the mechanism for electronic activation is electron spillover from $TiO_2$ to adsorbed O to form an activated $O^-$ intermediate that readily reacts with CO. This is depicted schematically in FIG. 11B. In the case of O vacancy doping, the energy of the sub-oxide band is 0.5-1.0 eV below the conduction band edge. This energy is much higher than kT ($\geq$13 kT at a reaction temperature of 443 K). Consequently, a reaction pathway that is electronically activated by free carriers in the conduction band of $TiO_2$ would not be thermally accessible until a temperature of ~6,000 K. However, because F insertion to $TiO_2$ increases the surface concentration of free electrons without formation of any mid-gap states, free electrons reside in the actual conduction band making this material an electronically active support for CO oxidation.

Figure 12:
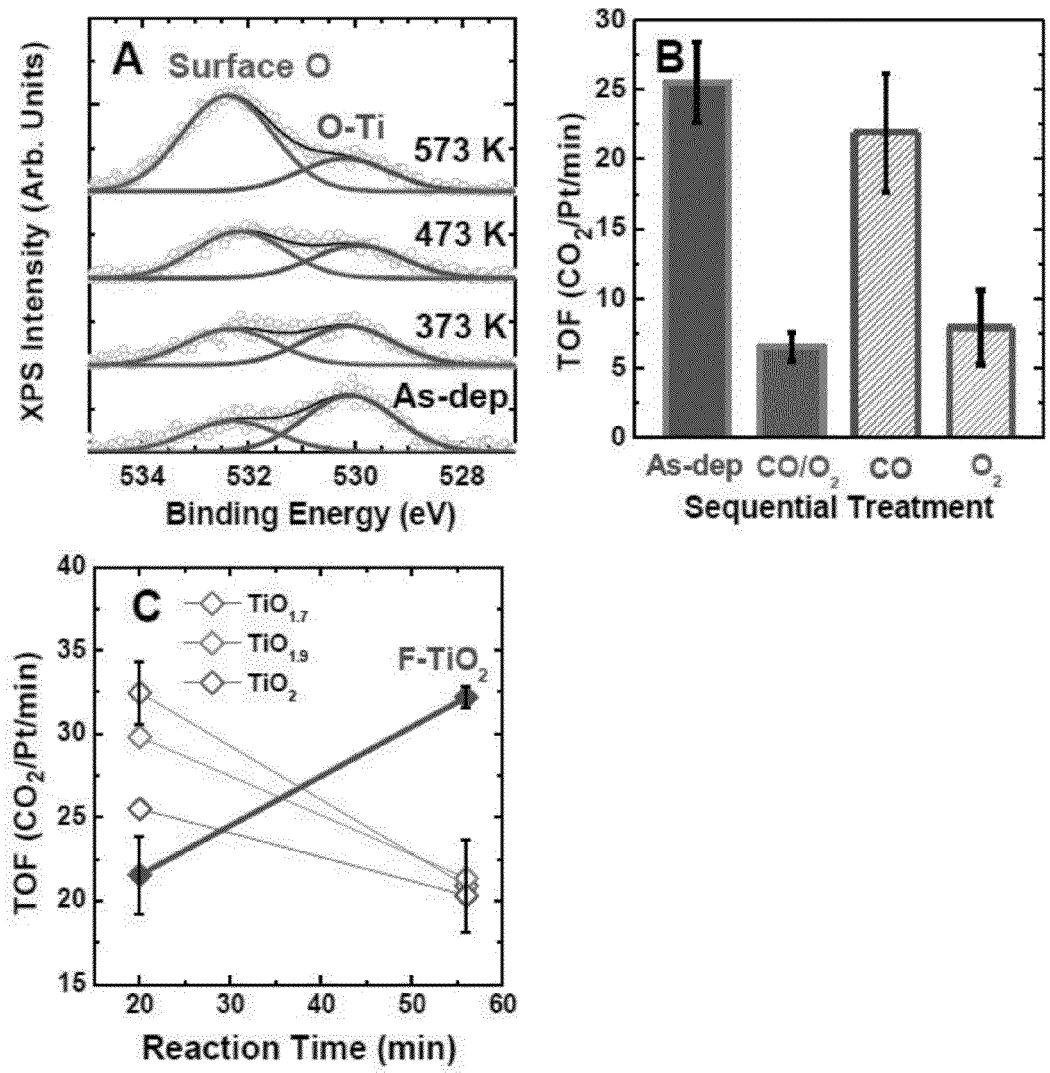
FIG. 12A illustrates the O 1s XPS spectrum for the $Pt/TiO_2$ catalyst following reaction at various temperatures.
FIG. 12B illustrates how the formation of surface O affects the activity of the undoped catalyst.
FIG. 12C illustrates time dependent reaction rate measurements for Pt on each $TiO_x$ stoichiometry and on F-doped $TiO_2$.
Figure 13:
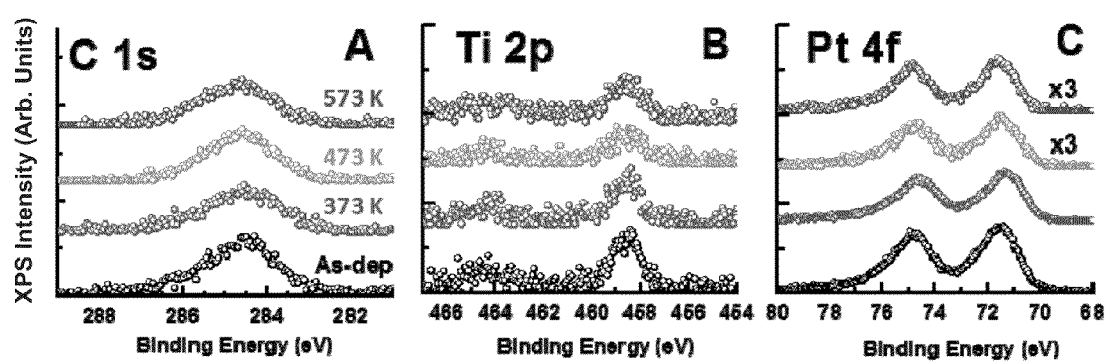
FIG. 13 shows the XPS spectra for C 1s (A), Ti 2p (B), and Pt 4f (C) states for the $Pt/TiO_2$ catalyst as-deposited.

XPS and reaction kinetics provide evidence that electronic activation by the F-doped support occurs by electron spillover to surface O. Fresh catalysts prepared and treated under reaction conditions for 1 h at 373, 473, or 573 K showed significant changes in the O 1s spectrum that correlate with deactivation of the undoped catalyst. FIG. 12A shows the O 1s XPS spectrum for the $Pt/TiO_2$ catalyst following reaction at various temperatures. FIG. 13 shows the XPS spectra for carbon "C" 1s (A), Ti 2p (B), and Pt 4f (C) states for the $Pt/TiO_2$ catalyst as-deposited (As-dep) and after 1 h in reaction conditions at 373, 473, and 573 K. In FIG. 12A, the surface O peak at high binding energy (~532.5 eV) increased with reaction temperature. The XPS spectra for the F-doped analog of this catalyst (not shown here) were identical to those shown in FIG. 12A. FIG. 12B shows how the formation of surface O affects the activity of the undoped catalyst. Embodiments of the invention disclose a TOF of ~25 $min^{-1}$ at 443 K; however, following reaction at high temperature (543 K), the catalyst deactivated by a factor of four. The initial activity was restored after removal of surface O by reaction with CO. Treatment in $O_2$ again resulted in catalyst deactivation by the formation of surface O.

We do not entirely understand the mechanism of catalyst deactivation by surface O, but at present we suggest the following: Surface O is an inactive species occupying catalytic sites, so deactivation is simply a result of blocking active sites with strongly bound O. Additionally, O acts as an electron acceptor, so it is possible that deactivation by surface O is partly an electronic phenomenon. Surface O may bind and localize free electrons in the titanium oxide support that are necessary for activating the catalytic reaction. This suggests that O activation is rate limiting for CO oxidation and is consistent with the idea that electronic activation by the F-doped $TiO_2$ sample occurs by electron spillover to adsorbed O to form an activated $O^-$ intermediate. FIG. 12C provides further evidence for this theory.

FIG. 12C shows time dependent reaction rate measurements for Pt on each $TiO_x$ stoichiometry and on F-doped $TiO_2$. Each undoped catalyst deactivated by 20-36% during 1 h under reaction conditions. However, Pt supported on F-doped $TiO_2$ showed a 49% rate increase. Embodiments of the invention disclose that these kinetics correspond to the formation of surface O during the reaction and the ability or inability of electrons from the oxide support to activate it for $CO_2$ formation. The high energy of the electrons in the F-doped stoichiometric support is responsible for enhancing the catalytic activity by electron spillover. However, this effect cannot occur with catalysts containing high concentrations of O vacancies. Although there is a high density of free carriers in these supports, they are trapped in the sub-oxide band structure.

Figure 14:
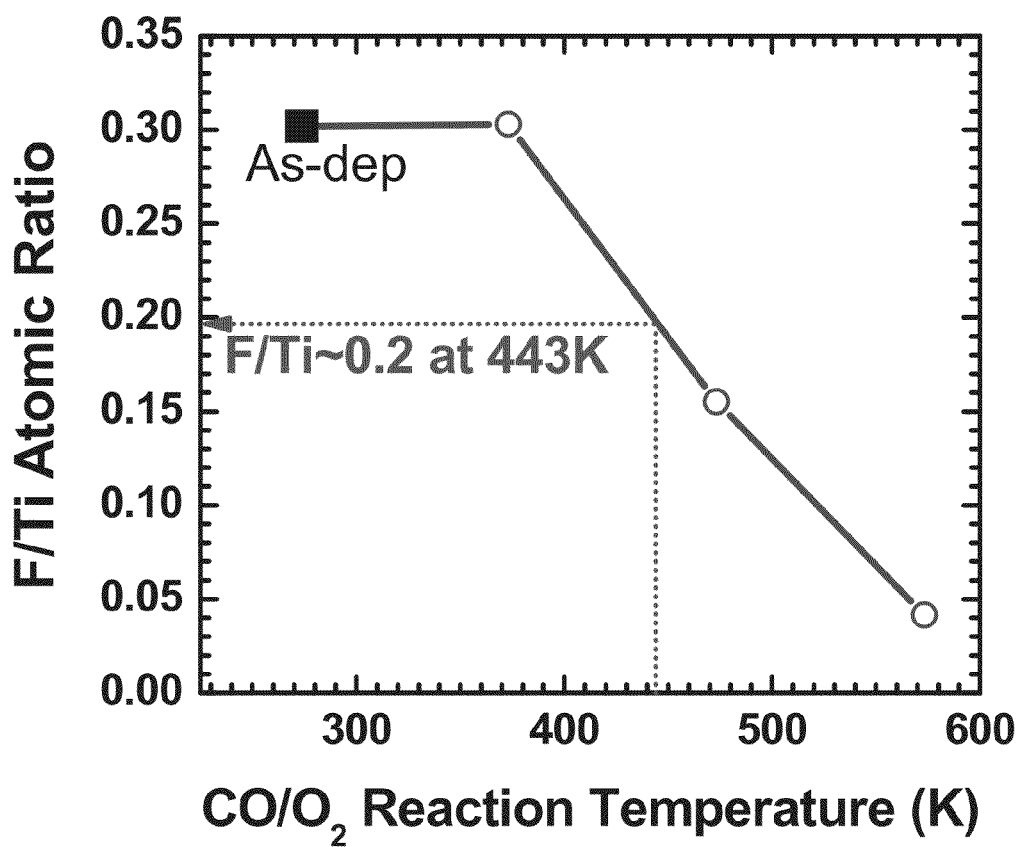
FIG. 14 illustrates the F to Ti Atomic Ratio in Titanium Oxide after Reaction.

Embodiments of the invention also investigated the stability of F in reaction conditions at 373, 473, and 573 K. XPS showed that F concentration decreased with increasing reaction temperature and was undetectable after 1 h at 573 K. FIG. 14 shows the F to Ti atomic ratio in F-doped $TiO_2$ as-deposited (As-dep) and after 1 h in reaction conditions at 373, 473, and 573 K. The atomic ratio is based on the integrated intensity of the F 1s and the Ti 2p XPS spectra and corrected for sensitivity factors. The F concentration decreases at increasing temperature, but F is still present up to 473 K. Although the surface F concentration began to decreases even at 473 K, it was still present at significant levels. Consequently, we safely assume that F remained in the support throughout the duration of the reaction rate measurements shown above which took place at 443 K.

Embodiments of the invention disclose an approximately twofold increase in the reaction rate of CO oxidation on a $Pt/TiO_2$ catalyst when the $TiO_2$ is made n-type by F doping. A correlation of this effect with the electronic structure of titanium oxide indicates that the mechanism responsible for increased catalytic activity is activation of surface O by electron spillover from the oxide support.

Noting that certain catalytic reactions proceed by charged intermediates, it seems intuitive that hot carriers can activate non-thermal reaction pathways by spillover to surface adsorbates. Hot carriers are difficult to generate in a metal catalyst because of their fast relaxation times. However, n-type doping of oxide semiconductors is a feasible method for supplying charges of controlled energy to a catalytic interface. This unique utility of oxides also enlightens the widely studied strong metal-support interaction (SMSI), in which the properties of an oxide used to support metal clusters strongly influences the activity and selectivity of the catalyst system.

This result demonstrates that tuning the electronic structure of metal-oxide semiconductors used as catalyst supports can provide access to reaction pathways that on other catalysts would not be thermally accessible. This ability implicates applications in many other charge mediated processes, including energy conversion reactions, electrochemical processes, solid acid/base catalysis, and selective partial oxidation chemistry.

Catalytic Transistor

It is well established that a transistor can control the surface electron density in a thin film with an external bias. Embodiments of the invention rely on this well established knowledge in combination with our own work to disclose a novel catalytic transistor that will provide a method for improving catalyst performance. In fact prior art transistors are capable of increasing the electron density in a charge transport channel by a factor of $10^8$; this is $10^6$ higher than we have described above for F doping a metal oxide. Consequently, the enhancement of catalytic performance using a transistor-like device will far exceed the enhancement observed by F doping a metal oxide.

Figure 15:
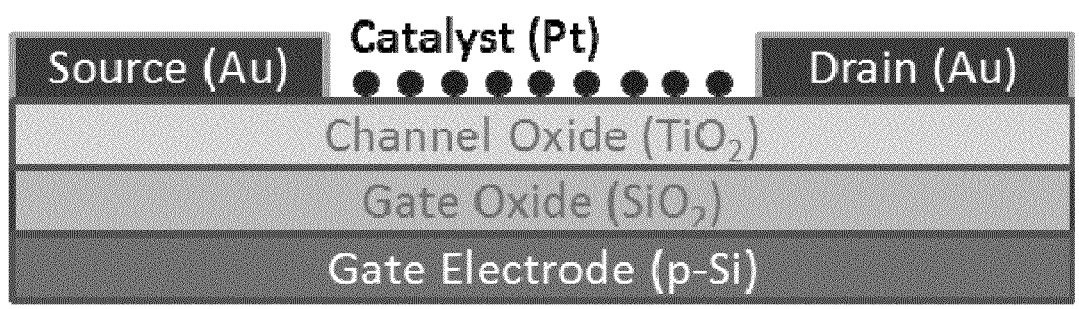
FIG. 15 illustrates a catalytic transistor utilizing a metal catalyst deposited on a surface of a metal oxide.

FIG. 15 illustrates a catalytic transistor utilizing a metal catalyst deposited on a surface of a metal oxide. In this embodiment, metal catalyst is Pt and the metal oxide is a doped metal oxide wherein a F-doped $TiO_2$ serves as a channel oxide that when electrically biased creates an electric field to reduce an over-potential to enhance an electrochemical reaction. It is understood that additional embodiments include a catalytic transistor with a semiconductor substrate with any catalyst deposited thereon.

Figure 16:
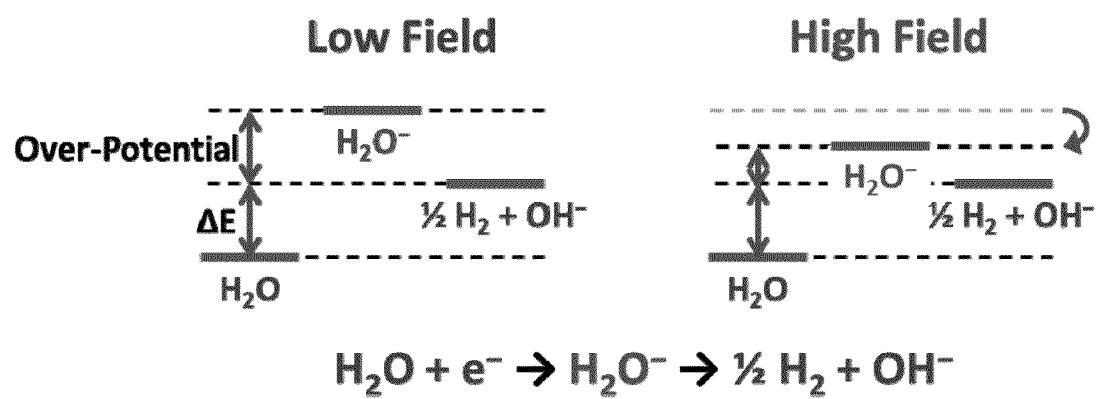
FIG. 16 illustrates the electric field at the surface of the catalyst reduces the over-potential required for electrochemical reactions as depicted for $H_2$ evolution by water $H_2O$ reduction.

Referring to FIG. 16, the electric field at the surface of the catalyst reduces the over-potential required for electrochemical reactions, in part by stabilizing the charged reaction intermediate. This is depicted for $H_2$ evolution by water $H_2O$ reduction.

Figure 17:
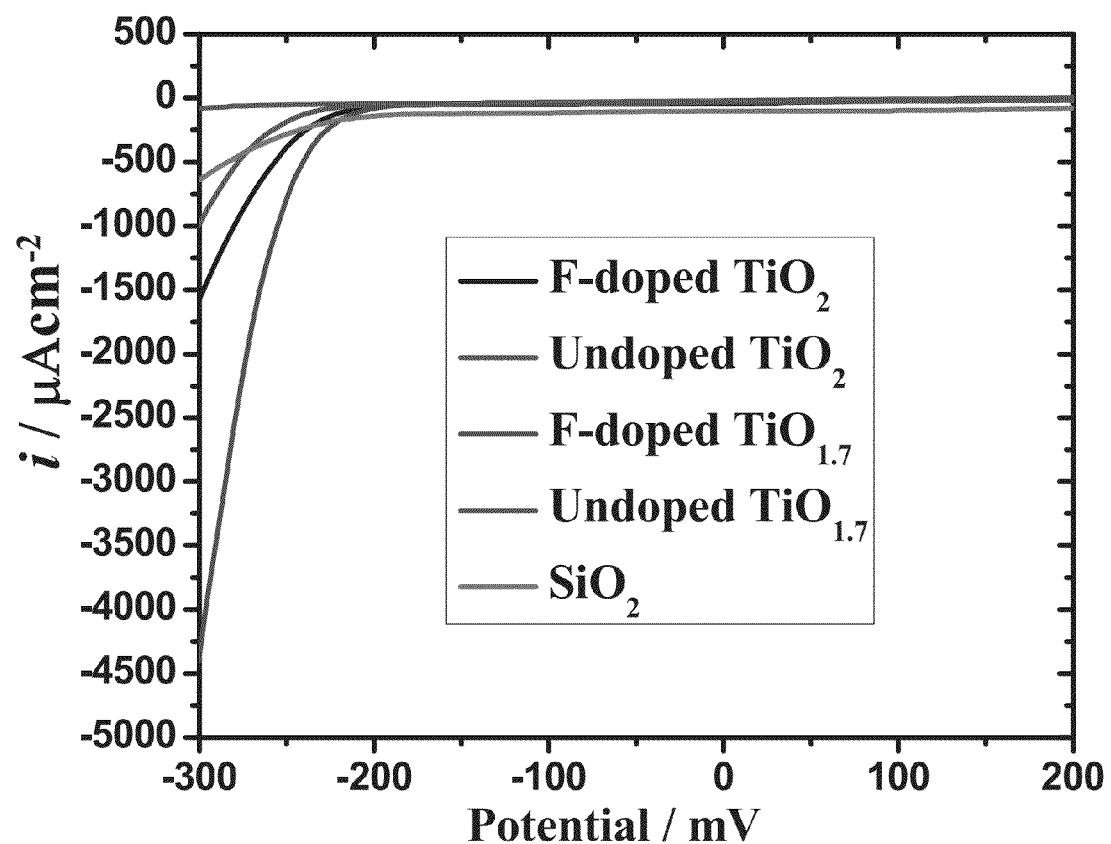
FIG. 17 illustrates current as a function of bias applied to a $Pt/TiO_2$ electrode in an electrochemical cell. The magnitude of the current corresponds to the amount of $H_2$ being produced from $H_2O$.

FIG. 17 illustrates the effect of F-doping to a $TiO_2$ substrates on the ability of supported Pt to produce $H_2$ from $H_2O$ at a reduced overpotential. As explained above, this effect can be magnified if a catalytic transistor, as shown in FIG. 15, is used as the $H_2$ producing electrode in place of Pt on F-doped titanium oxide. In this case, a gate bias rather than F doping would generate the electric field necessary to reduce the overpotential of the reaction.

The catalyst was a 0.5 nm Pt film deposited on various doped and undoped supports. The results indicate that the F-doped supports are much more active for $H_2$ production than are the undoped supports at a fixed electrochemical potential. In fact embodiments of the invention disclose that 0.5 nm Pt deposited on F-doped $TiO_{1.7}$ was even more active than pure Pt even though the total mass of Pt present was much less making the supported Pt thin film much less expensive. Pt is the current catalyst of choice for electrochemical $H_2$ production from water.

Embodiments of the invention demonstrate that halogen doping of a metal oxide used to support a metal catalyst controls the rate and the selectivity of catalytic reactions. Specifically, Embodiments of the invention describe this for CO oxidation and methanol oxidation. Further, this will be true for peroxide and epoxide synthesis.

Embodiments of the invention demonstrate the utility of oxide doping using a thin film geometry and a mesoporous geometry. While the thin film geometry is useful for electrochemical reactions as discussed above, other reactions benefit from a mesoporous geometry because the mesoporous geometry dramatically increases the surface area of the catalyst.

Embodiments of the invention have been described herein in considerable detail to provide those skilled in the art with information relevant to apply the novel principles and to construct and use such specialized components as are required. However, it is to be understood that embodiments of the invention can be carried out by different equipment, materials and devices, and that various modifications, both as to the equipment and operating procedures, can be accomplished without departing from the scope of the invention itself.

We claim:

1. A composition of matter comprising:
   a transition metal oxide, the transition metal oxide including oxygen vacancies;
   a halogen, halogen atoms filling the oxygen vacancies and passivating the transition metal oxide; and
   a metal catalyst disposed on the transition metal oxide in the form of a layer of material, the layer of material being discontinuous such that at least some of the transition metal oxide is exposed.

2. The composition of matter of claim 1 wherein the halogen comprises fluorine.

3. The composition of matter of claim 1 wherein the halogen comprises chlorine.

4. The composition of matter of claim 1 wherein the metal catalyst comprises platinum.

5. The composition of matter of claim 1 wherein the layer is about 0.5 nanometers thick.

6. The composition of matter of claim 1 wherein the transition metal oxide comprises an oxide selected from a group consisting of $TiO_2$, $Co_2O_3$, $CeO_2$, $ZnO$, $SnO$, and $WO_2$.

7. The composition of matter of claim 1 wherein the structure is operable to catalyze the oxidation of carbon monoxide.

8. The composition of matter of claim 1 wherein the transition metal oxide is disposed over a semiconductor.

9. The composition of matter of claim 1 wherein the transition metal oxide includes less than 3% oxygen vacancies.

10. A composition of matter comprising:
    a transition metal oxide, the transition metal oxide including less than 3% oxygen vacancies;
    a halogen, halogen atoms filling the oxygen vacancies and passivating the transition metal oxide; and
    a metal catalyst disposed on the transition metal oxide.

11. The composition of matter of claim 10 wherein the metal catalyst is in the form of nanoparticles.

12. The composition of matter of claim 10 wherein the halogen comprises a gas selected from a group consisting of fluorine and chlorine.

13. The composition of matter of claim 10 wherein the transition metal oxide comprises an oxide selected from a group consisting of $TiO_2$, $Co_2O_3$, $CeO_2$, $ZnO$, $SnO$, and $WO_2$.

14. The composition of matter of claim 10 wherein the metal catalyst comprises platinum.

15. The composition of matter of claim 10 wherein the metal catalyst is in the form of a layer of material, and wherein the layer is about 0.5 nanometers thick.

16. A composition of matter comprising:
    a transition metal oxide, the transition metal oxide including oxygen vacancies;
    a halogen, halogen atoms filling the oxygen vacancies and passivating the transition metal oxide; and
    a metal catalyst disposed on the transition metal oxide in the form of a layer of material, the layer of material being about 0.5 nanometers thick.

17. The composition of matter of claim 16 wherein the halogen comprises a gas selected from a group consisting of fluorine and chlorine.

18. The composition of matter of claim 16 wherein the metal catalyst comprises platinum.

19. The composition of matter of claim 16 wherein the transition metal oxide includes less than 3% oxygen vacancies.

20. The composition of matter of claim 16 wherein the transition metal oxide comprises an oxide selected from a group consisting of $TiO_2$, $Co_2O_3$, $CeO_2$, $ZnO$, $SnO$, and $WO_2$.

21. The composition of matter of claim 16 wherein the transition metal oxide is disposed over a semiconductor.

* * * * *